(12) United States Patent
Kato et al.

(10) Patent No.: US 10,964,552 B2
(45) Date of Patent: Mar. 30, 2021

(54) METHODS FOR PRODUCING LAMINATE AND SUBSTRATE FOR MOUNTING A SEMICONDUCTOR DEVICE

(71) Applicant: MITSUBISHI GAS CHEMICAL COMPANY, INC., Tokyo (JP)

(72) Inventors: Yoshihiro Kato, Yamagata (JP); Takaaki Ogashiwa, Yamagata (JP); Yoichi Nakajima, Yamagata (JP); Takaaki Ichikawa, Yamagata (JP); Kazuaki Kawashita, Yamagata (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 537 days.

(21) Appl. No.: 15/326,831

(22) PCT Filed: Jul. 15, 2015

(86) PCT No.: PCT/JP2015/070299
§ 371 (c)(1),
(2) Date: Jan. 17, 2017

(87) PCT Pub. No.: WO2016/010083
PCT Pub. Date: Jan. 21, 2016

(65) Prior Publication Data
US 2017/0213745 A1    Jul. 27, 2017

(30) Foreign Application Priority Data
Jul. 18, 2014   (JP) .............................. JP2014-147703

(51) Int. Cl.
*H01L 21/48*   (2006.01)
*H05K 3/46*    (2006.01)
(Continued)

(52) U.S. Cl.
CPC .......... *H01L 21/4846* (2013.01); *B32B 3/266* (2013.01); *B32B 15/20* (2013.01);
(Continued)

(58) Field of Classification Search
CPC .... H05K 1/115; H05K 3/0061; H05K 3/0058; H05K 3/0064; H05K 3/0067; H05K 3/46;
(Continued)

(56) References Cited

U.S. PATENT DOCUMENTS 5,231,751 A * 8/1993 Sachdev .............. H05K 3/0061
                                                           216/18
6,548,767 B1   4/2003 Lee et al.
(Continued)

FOREIGN PATENT DOCUMENTS

CN       102194703 A      9/2011
CN       103119710 A      5/2013
(Continued)

OTHER PUBLICATIONS

International Search Report issued in Patent Application No. PCT/JP2015/070299, dated Oct. 6, 2015.
(Continued)

*Primary Examiner* — A. Dexter Tugbang
(74) *Attorney, Agent, or Firm* — Greenblum & Bernstein, P.L.C.

(57) ABSTRACT

A method for producing a laminate that includes at least the following: providing a first intermediate laminate comprising a carrier substrate including a support therein and a peelable metal layer formed on at least one surface of the carrier substrate; forming, in a section not serving as a product of the first intermediate laminate, a first hole reaching at least the support in the carrier substrate from a surface of the first intermediate laminate, to prepare a second intermediate laminate with the first hole; stacking and dis-
(Continued)

posing on the surface where the first hole is formed of the second intermediate laminate, an insulating material and a metal foil in this order when viewed from the surface; and pressurizing the second intermediate laminate, the insulating material and the metal foil in the stacking direction thereof with heating, to prepare a third intermediate laminate where the first hole is filled with the insulating material; and performing treatment with a chemical agent on the third intermediate laminate.

2 Claims, 9 Drawing Sheets

(51) Int. Cl.

| | | |
|---|---|---|
| *H01L 23/498* | (2006.01) | |
| *H01L 23/12* | (2006.01) | |
| *H05K 3/00* | (2006.01) | |
| *B32B 3/26* | (2006.01) | |
| *B32B 15/20* | (2006.01) | |
| *B32B 37/02* | (2006.01) | |
| *B32B 37/00* | (2006.01) | |
| *B32B 38/04* | (2006.01) | |
| *B32B 38/10* | (2006.01) | |
| *H01L 21/683* | (2006.01) | |
| *H01L 23/544* | (2006.01) | |
| *H05K 1/11* | (2006.01) | |

(52) U.S. Cl.
CPC ............ *B32B 37/02* (2013.01); *B32B 37/187* (2013.01); *B32B 38/04* (2013.01); *B32B 38/10* (2013.01); *H01L 21/486* (2013.01); *H01L 21/4857* (2013.01); *H01L 21/4864* (2013.01); *H01L 21/6835* (2013.01); *H01L 23/12* (2013.01); *H01L 23/49822* (2013.01); *H01L 23/49827* (2013.01); *H01L 23/49838* (2013.01); *H01L 23/49866* (2013.01); *H01L 23/544* (2013.01); *H05K 3/0058* (2013.01); *H05K 3/0061* (2013.01); *H05K 3/46* (2013.01); *H05K 3/4602* (2013.01); *B32B 2260/021* (2013.01); *B32B 2305/076* (2013.01); *B32B 2307/202* (2013.01); *B32B 2307/206* (2013.01); *B32B 2311/12* (2013.01); *B32B 2457/14* (2013.01); *H01L 2221/68345* (2013.01); *H01L 2221/68359* (2013.01); *H01L 2223/54426* (2013.01); *H01L 2924/0002* (2013.01); *H05K 1/115* (2013.01); *H05K 3/0067* (2013.01); *H05K 3/4611* (2013.01); *Y10T 29/4913* (2015.01); *Y10T 29/49126* (2015.01); *Y10T 29/49155* (2015.01); *Y10T 29/49165* (2015.01)

(58) Field of Classification Search
CPC .............. H05K 3/4602; H05K 3/4611; Y10T 29/49126; Y10T 29/4913; Y10T 29/49155; Y10T 29/49165; H01L 23/12; H01L 23/49822; H01L 23/49827; H01L 23/49838; H01L 23/49866; H01L 23/544; H01L 21/4846; H01L 21/4857; H01L 21/486; H01L 21/4864; H01L 21/6835; H01L 2221/68345; H01L 2221/68359; H01L 2223/54426; H01L 2924/00; H01L 2924/0002; B32B 3/266; B32B 15/20; B32B 37/02; B32B 37/187; B32B 38/04; B32B 38/10; B32B 2305/076; B32B 2307/202; B32B 2307/206; B32B 2311/12; B32B 2457/14; B32B 2260/021
See application file for complete search history.

(56) References Cited

U.S. PATENT DOCUMENTS

| | | |
|---|---|---|
| 2007/0190237 A1 | 8/2007 | Kyozuka |
| 2008/0163486 A1* | 7/2008 | Imamura ........... Y10T 29/49126 29/832 |
| 2009/0051041 A1* | 2/2009 | Otsuka ................. H05K 3/4602 257/774 |
| 2011/0154657 A1 | 6/2011 | Chuang et al. |
| 2011/0154658 A1 | 6/2011 | Chuang et al. |
| 2011/0253439 A1 | 10/2011 | Huang |
| 2012/0279630 A1 | 11/2012 | Chuang et al. |
| 2012/0280022 A1 | 11/2012 | Huang |

FOREIGN PATENT DOCUMENTS

| | | |
|---|---|---|
| JP | 59-500341 | 3/1984 |
| JP | 2007-214427 | 8/2007 |
| JP | 2010-56231 | 3/2010 |
| JP | 2011-139064 | 7/2011 |
| JP | 2011-192757 | 9/2011 |
| JP | 2011-228617 A | 11/2011 |
| JP | 2012-109430 | 6/2012 |
| JP | 2013-201322 | 10/2013 |
| JP | 2014187360 A * | 10/2014 |
| TW | 200746973 A | 12/2007 |
| WO | 83/03065 | 9/1983 |
| WO | 2005/029933 A1 | 3/2005 |

OTHER PUBLICATIONS

International Preliminary Report on Patentability issued in PCT/JP2015/070299, dated Jan. 24, 2017.

* cited by examiner

[Figure 1]
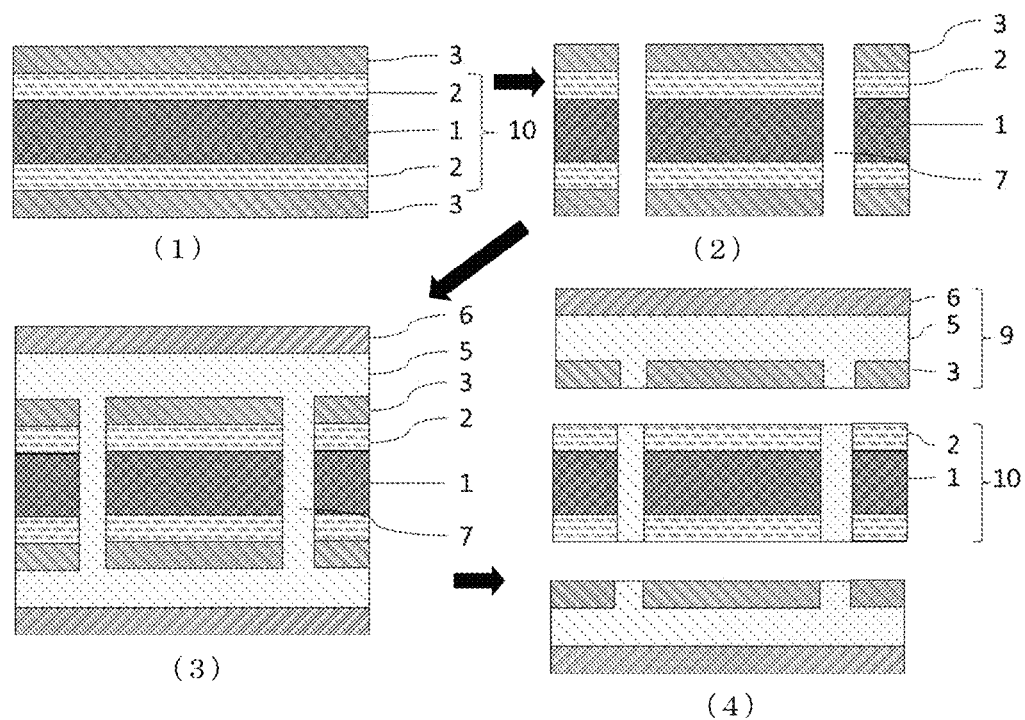

[Figure 2]
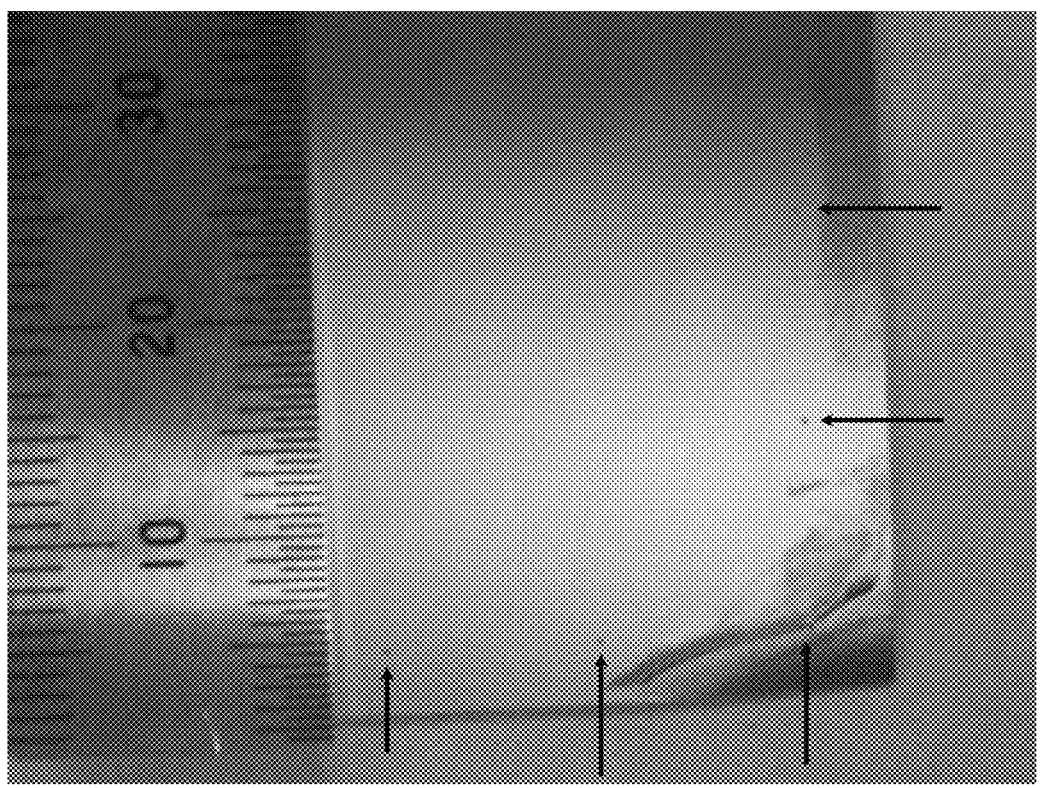

[Figure 3]
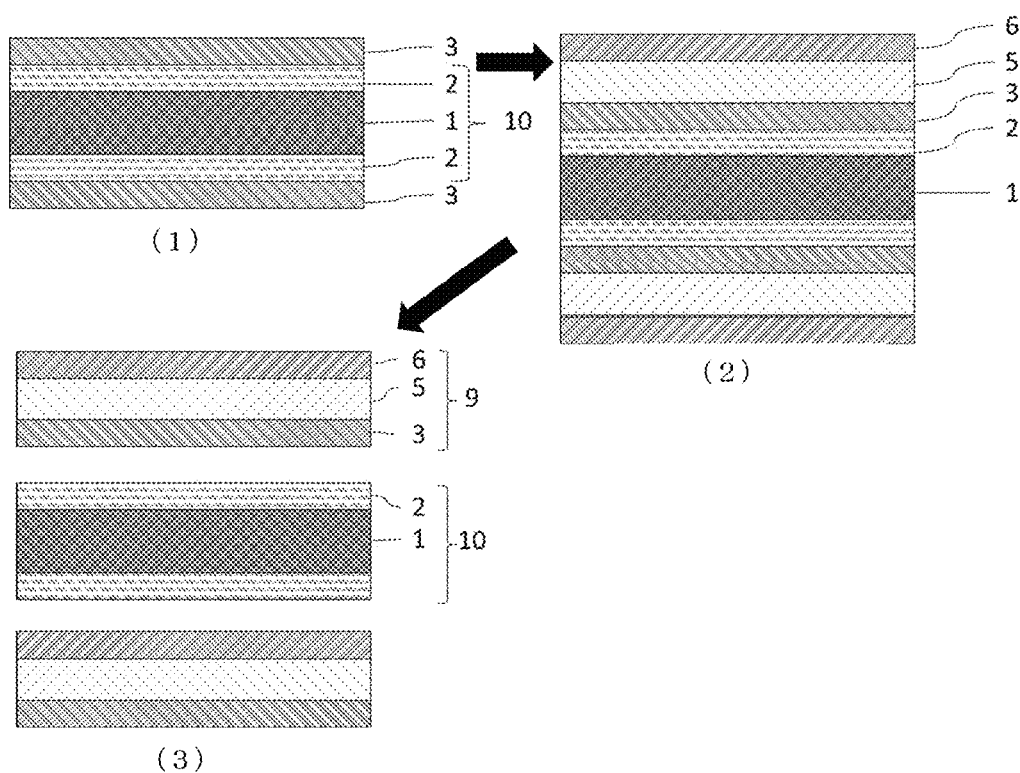

[Figure 4]
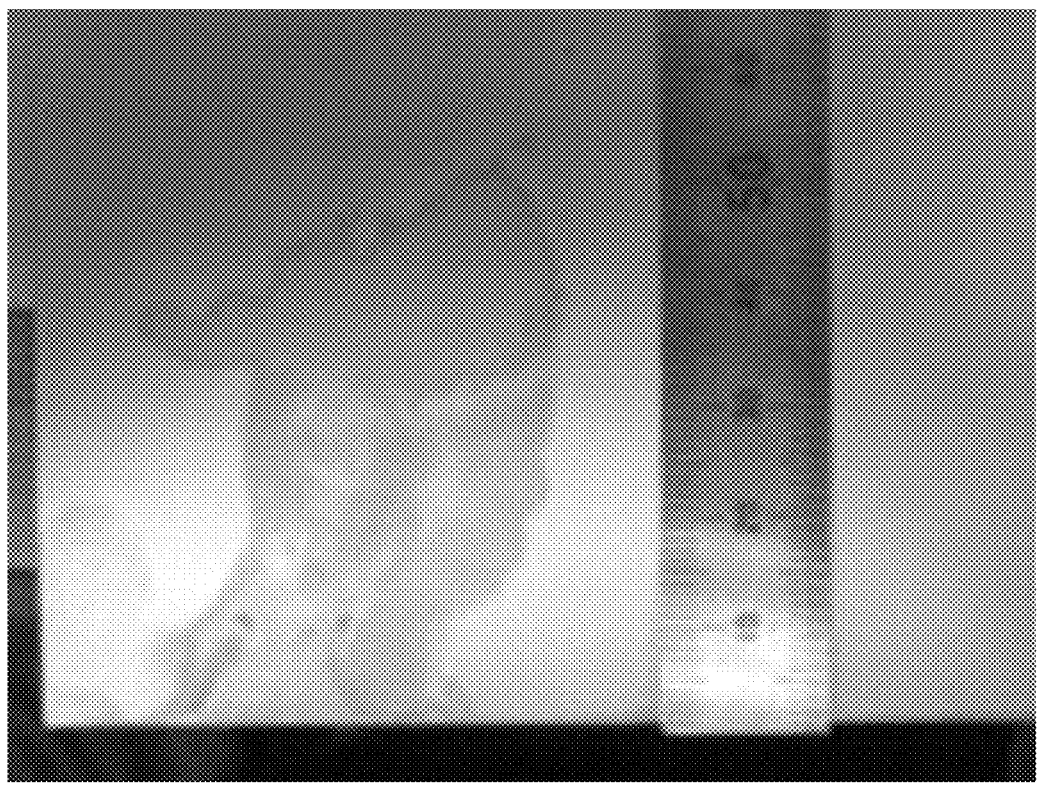

[Figure 5]
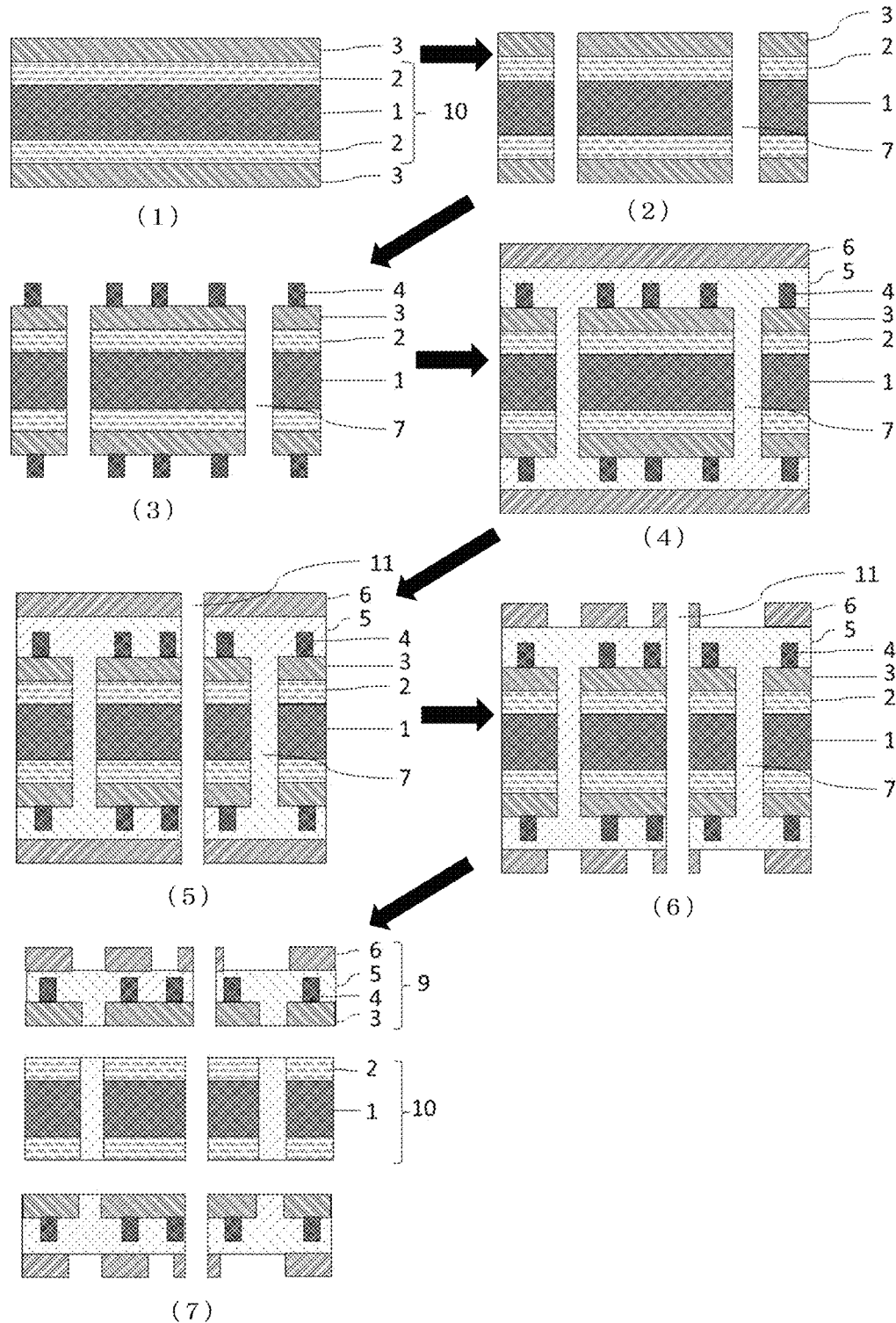

[Figure6]
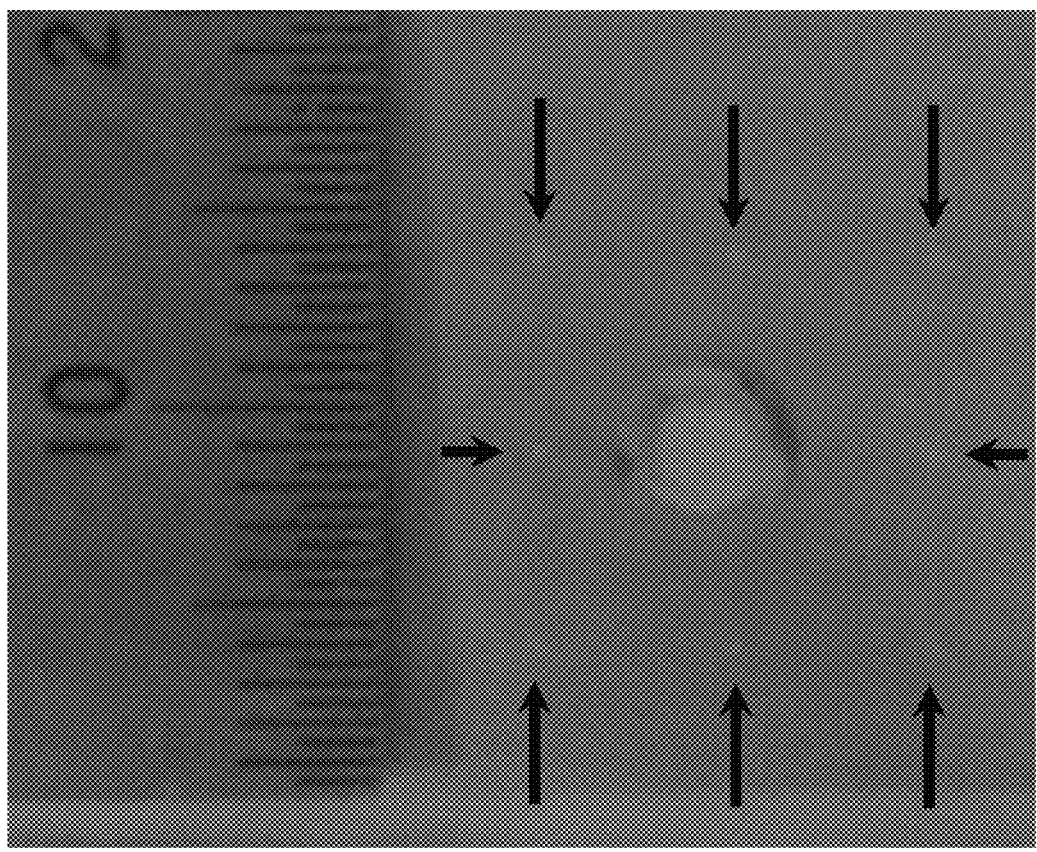

[Figure 7]
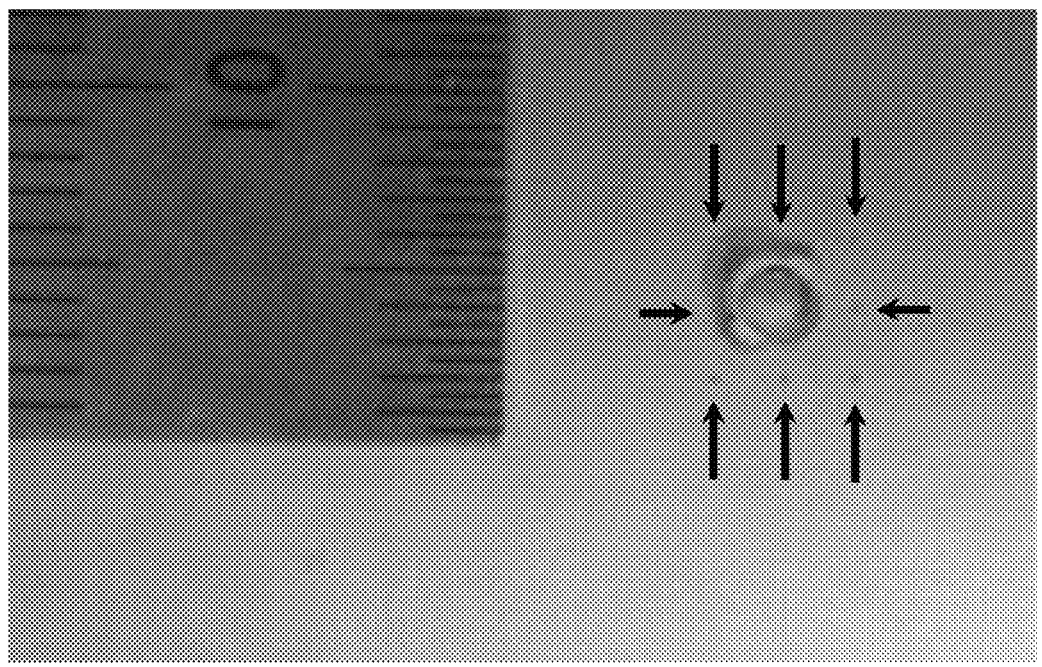

[Figure 8]
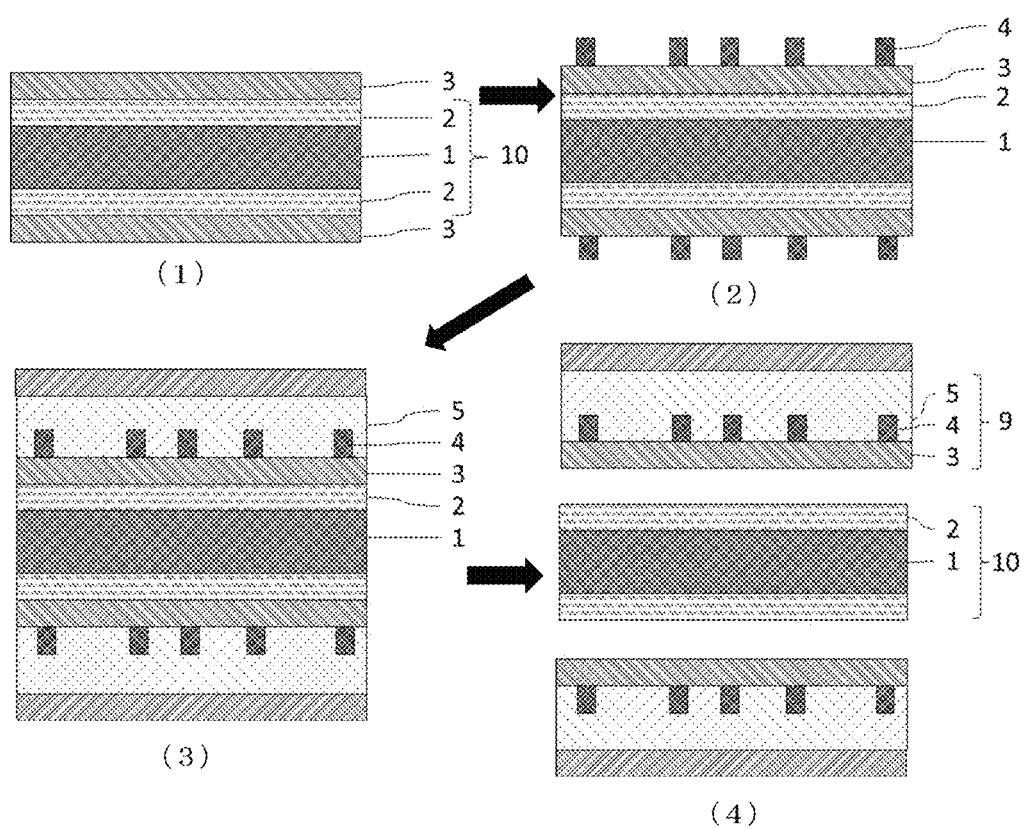

[Figure 9]
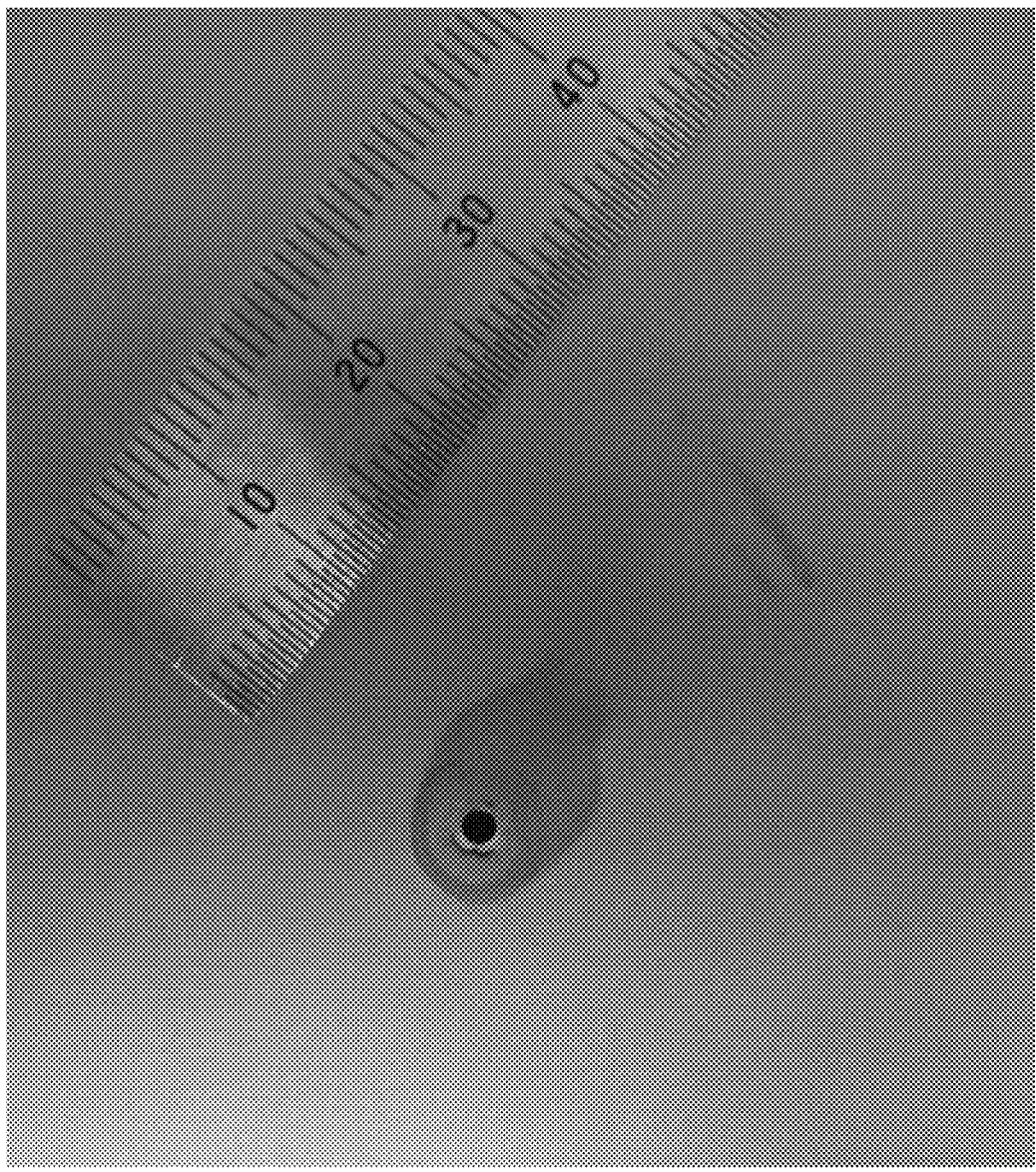

METHODS FOR PRODUCING LAMINATE AND SUBSTRATE FOR MOUNTING A SEMICONDUCTOR DEVICE

TECHNICAL FIELD

The present invention relates to a laminate and a substrate for mounting a semiconductor device, and methods for producing them.

BACKGROUND ART

High functionality and downsizing of a semiconductor package widely used in electronic equipment, communication equipment, a personal computer and the like have been increasingly accelerated in recent years. According to this, a printed wiring board and a substrate for mounting a semiconductor device in the semiconductor package have been demanded to be thinner. The printed wiring board and the substrate for mounting a semiconductor device are usually made by stacking a layer serving as a circuit pattern (hereinafter, also simply referred to as "circuit pattern layer".) and an insulating material on a support substrate. If the printed wiring board and the substrate for mounting a semiconductor device are tried to be produced without any support substrate for the purpose of thinning, the existing production apparatus is used to thereby often cause the printed wiring board and the substrate for mounting a semiconductor device to fracture, and/or the printed wiring board and the substrate for mounting a semiconductor device to be wound to a conveyor. Therefore, the printed wiring board and the substrate for mounting a semiconductor device have difficulty in production for the purpose of thinning by use of the existing production apparatus.

As a method for solving such a problem, for example, Patent Literature 1 discloses a method for producing a thin printed wiring board, including forming a circuit pattern, by pattern plating, on a laminate where a copper layer peelable in a subsequent step is formed on a highly rigid support substrate (carrier substrate) such as stainless steel, stacking an insulation layer such as fiber glass covered with an epoxy resin, subjecting the resultant to a heating and pressurizing treatment, and finally peeling and removing the support substrate. Thus, the circuit pattern and the insulating material can be stacked on the highly rigid support substrate and finally the support substrate can be peeled and removed to thereby produce a thin printed wiring board and a substrate for mounting a semiconductor device even in the existing production apparatus.

CITATION LIST

Patent Literature

[Patent Literature 1] National Publication of International Patent Application No. 59-500341

SUMMARY OF INVENTION

Technical Problem

When a thin printed wiring board and a substrate for mounting a semiconductor device are produced by the method described in Patent Literature 1, however, a chemical agent for use in formation of the circuit pattern easily penetrates from the end portion of the laminate and the end portion of a processed hole into the interface between the carrier substrate and the peelable metal layer. Consequently, the following problems are caused: the appearance of a laminate obtained by peeling the carrier substrate is not good and the thickness of the metal layer serving as the outermost layer after peeling of the carrier substrate is ununiform. In order to suppress penetration of the chemical agent, it is considered that the peeling strength of the carrier substrate from the peelable metal layer is made higher. Such a high peeling strength, however, causes breakage and warpage of the laminate to occur in peeling of the carrier substrate. Thus, the peeling strength of the carrier substrate from the peelable metal layer is adjusted for suppression of penetration of the chemical agent, to thereby cause the yield in production of a thin printed wiring board and a substrate for mounting a semiconductor device to be reduced.

The present invention has been made in view of the above circumstances, and an object thereof is to provide a laminate made by stacking a metal foil and an insulating material on an intermediate laminate provided with a carrier substrate and a peelable metal layer formed on the substrate, and if necessary, finally removing the carrier substrate, wherein penetration of a chemical agent into the interface between the carrier substrate and the peelable metal layer is suppressed; a substrate for mounting a semiconductor device made from the laminate; and methods for producing them.

Solution to Problem

The present inventor has made intensive studies in order to solve the above problems, and as a result, has found that, in production of a laminate, a predetermined hole is provided in a section not finally serving as a product, prior to a step of performing treatment with a chemical agent, and the hole is filled with an insulating material to thereby reduce penetration of the chemical agent caused in the treatment with a chemical agent, leading to completion of the present invention.

That is, the present invention is as follows.

[1]
A laminate produced by a production method having at least:

a step of providing a first intermediate laminate provided with a carrier substrate including a support therein and a peelable metal layer formed on at least one surface of the carrier substrate, a step of forming, in a section not serving as a product of the first intermediate laminate, a first hole reaching at least the support in the carrier substrate from a surface of the first intermediate laminate, to prepare a second intermediate laminate with the first hole, a step of stacking and disposing on the surface where the first hole is formed of the second intermediate laminate, an insulating material and a metal foil in this order when viewed from the surface, and pressurizing the second intermediate laminate, the insulating material and the metal foil in the stacking direction thereof with heating, to prepare a third intermediate laminate where the first hole is filled with the insulating material, and a step of performing treatment with a chemical agent on the third intermediate laminate.

[2]
The laminate according to [1], wherein an end portion of the first hole is located at a distance of 50 mm or less from an end portion of the laminate.

[3]
The laminate according to [1] or [2], wherein the production method comprises a step of providing a second hole for alignment between the step of making the third intermediate laminate and the step of performing treatment with a chemical agent, and the first hole is provided at least at a position closer to an end portion of the laminate than an end portion of the second hole and a position closer to the end portion of the second hole than the end portion of the laminate or equidistant from these end portions, in the step of making the second intermediate laminate.

[4]

The laminate according to [3], wherein an end portion of the first hole provided at a position closer to the end portion of the second hole than the end portion of the laminate or equidistant from these end portions is located at a distance of 50 mm or less from the end portion of the second hole.

[5]

The laminate according to any one of [1] to [4], wherein the production method further comprises a step of removing the carrier substrate from the third intermediate laminate after the step of performing treatment with a chemical agent.

[6]

The laminate according to any one of [1] to [5], wherein a cross-sectional area of the first hole is 0.002 mm$^2$ or more and 8 mm$^2$ or less, and the number of the first holes per 100 mm square is 3 or more.

[7]

The laminate according to any one of [1] to [6], wherein a thickness of the carrier substrate is 30 to 250 μm.

[8]

The laminate according to any one of [1] to [7], wherein a thickness of the metal layer is 20 μm or less.

[9]

The laminate according to any one of [1] to [8], wherein a peeling strength at an interface between the carrier substrate and the metal layer is 1 to 50 N/m.

[10]

The laminate according to any one of [1] to [9], wherein the step of performing treatment with a chemical agent is a step of removing a smear generated in formation of a non-through hole by laser processing.

[11]

The laminate according to any one of [1] to [10], wherein the step of performing treatment with a chemical agent is a step of plating a surface of the metal foil.

[12]

The laminate according to any one of [1] to [11], wherein the step of performing treatment with a chemical agent is a step of forming a circuit pattern from the metal foil by a subtractive method.

[13]

The laminate according to any one of [1] to [12], wherein the first intermediate laminate is a laminate made by stacking on one surface or both surfaces of the support, a metal foil with a carrier metal foil, provided with a carrier metal foil and a metal foil thinner than the carrier metal foil.

[14]

The laminate according to [13], wherein a thickness of the metal foil in the metal foil with a carrier metal foil is 5 μm or less.

[15]

The laminate according to [13] or [14], wherein the metal foil with a carrier metal foil is copper foil with a carrier copper foil, provided with carrier copper foil and copper foil thinner than the carrier copper foil.

[16]

The laminate according to any one of [1] to [15], wherein a thickness of the support is 5 to 200 μm.

[17]

The laminate according to any one of [1] to [16], wherein the support is an insulating material.

[18]

The laminate according to any one of [1] to [17], wherein the insulating material is a prepreg.

[19]

The laminate according to any one of [1] to [18], wherein the metal foil is copper foil.

[20]

A laminate having a build-up structure, produced by a production method having one or two or more steps of stacking and disposing a metal foil and an insulating material on one surface or both surfaces of the laminate according to any one of [1] to [19], and pressurizing the laminate, the metal foil and the insulating material in the stacking direction thereof with heating.

[21]

A substrate for mounting a semiconductor device, produced by a production method having a step of forming a circuit pattern on an outer layer of the laminate according to any one of [1] to [20], by a subtractive method.

[22]

A method for producing a laminate, having at least:

a step of providing a first intermediate laminate provided with a carrier substrate including a support therein and a peelable metal layer formed on at least one surface of the carrier substrate, a step of forming, in a section not serving as a product of the first intermediate laminate, a first hole reaching at least the support in the carrier substrate from a surface of the first intermediate laminate, to prepare a second intermediate laminate with the first hole, a step of stacking and disposing on the surface where the first hole is formed of the second intermediate laminate, an insulating material and a metal foil in this order when viewed from the surface, and pressurizing the second intermediate laminate, the insulating material and the metal foil in the stacking direction thereof with heating, to prepare a third intermediate laminate where the first hole is filled with the insulating material, and a step of performing treatment with a chemical agent on the third intermediate laminate.

[23]

A method for producing a substrate for mounting a semiconductor device, having a step of forming a circuit pattern on an outer layer of a laminate obtained by the method for producing a laminate according to [22], by a subtractive method.

Advantageous Effects of Invention

The present invention can provide a laminate made by stacking a metal foil and an insulating material on an intermediate laminate provided with a carrier substrate and a peelable metal layer formed on the substrate, and if necessary, finally removing the carrier substrate, wherein penetration of a chemical agent into the interface between the carrier substrate and the peelable metal layer is suppressed; a substrate for mounting a semiconductor device made from the laminate; and methods for producing them.

BRIEF DESCRIPTION OF DRAWINGS

FIG. 1 includes schematic views illustrating steps of making a laminate of an Example.

FIG. 2 is a photograph of a portion of a laminate of an Example, where penetration of a chemical agent is observed.

FIG. 3 includes schematic views illustrating steps of making a laminate of a Comparative Example.

FIG. 4 is a photograph of a portion of a laminate of a Comparative Example, where penetration of a chemical agent is observed.

FIG. 5 includes schematic views illustrating steps of making a laminate in another Example.

FIG. 6 is a photograph of an alignment hole and the periphery thereof in a laminate of another Example.

FIG. 7 is a photograph of an alignment hole and the periphery thereof in a laminate of still another Example.

FIG. 8 includes schematic views illustrating steps of making a laminate in another Comparative Example.

FIG. 9 is a photograph of an alignment hole and the periphery thereof in a laminate of another Comparative Example.

DESCRIPTION OF EMBODIMENTS

Hereinafter, an embodiment (hereinafter, simply referred to as "the present embodiment".) for carrying out the present invention is described in detail if necessary with reference to the drawings, but the present invention is not limited to the following present embodiment. The present invention can be variously modified without departing the gist thereof. Herein, the same symbol is attached to the same element in the drawings, and overlapping description is omitted. In addition, the positional relationship such as top, bottom, left and right is based on the positional relationship illustrated in the drawings, unless otherwise noted. Furthermore, the dimensional ratio in the drawings is not limited to the ratio illustrated. Herein, while a laminate and each intermediate laminate are those where respective layers adhere to each other, the respective layers may also be peelable from each other, if necessary.

First, a laminate of the present embodiment is described in detail. The laminate of the present embodiment is a laminate produced by a production method including at least a step of providing a first intermediate laminate provided with a carrier substrate (G) including a support (F) therein and a peelable metal layer (M) formed on at least one surface of the carrier substrate (G), a step of forming, in a section not serving as a product of the first intermediate laminate, a first hole (H) (hereinafter, simply referred to as "hole "H"".) reaching at least the support (F) in the carrier substrate (G) from the surface of the first intermediate laminate, to prepare a second intermediate laminate with the hole (H), a step of stacking and disposing on the surface where the hole (H) is formed of the second intermediate laminate, an insulating material (J) and a metal foil in this order when viewed from the surface, and pressurizing the second intermediate laminate, the insulating material (J) and the metal foil in the stacking direction thereof with heating, to prepare a third intermediate laminate where the hole (H) is filled with the insulating material (J), and a step of performing treatment with a chemical agent on the third intermediate laminate. That is, the laminate of the present embodiment is a laminate made by the production method including at least steps 1 to 4 below. Among these steps, steps 2 to 4 may be continuously repeated multiple times, if necessary, and step 4 may be singly repeated multiple times, if necessary.

Step 1: a step of providing a first intermediate laminate provided with a carrier substrate (G) including a support (F) therein and a metal layer (M) formed on at least one surface of the carrier substrate (G).

Step 2: a step of forming, in a section not serving as a product of the first intermediate laminate, a hole (H) reaching at least the support (F) in the carrier substrate (G) from the surface of the first intermediate laminate, to prepare a second intermediate laminate with the hole (H).

Step 3: a step of disposing on the surface where the hole (H) is formed of the second intermediate laminate, an insulating material (J) and a metal foil in this order when viewed from the surface, and pressurizing the second intermediate laminate, the insulating material (J) and the metal foil in the stacking direction thereof with heating, to prepare a third intermediate laminate where the hole (H) is filled with the insulating material (J).

Step 4: a step of performing treatment with a chemical agent on the third intermediate laminate.

In addition, another mode of the laminate of the present embodiment is a laminate produced by further undergoing the following step 5 after steps 1 to 4 above.

Step 5: a step of removing the carrier substrate (G) from the third intermediate laminate.

A laminate obtained by removal of the carrier substrate (G) in step 5 is preferably used in a coreless printed wiring board. In particular, a circuit pattern is formed on the outer layer of the laminate obtained by removal of the carrier substrate (G), by a subtractive method, to thereby provide a substrate for mounting a semiconductor device.

In the present embodiment, formation of the hole (H) (hereinafter, hole formation is also referred to as "hole punching".) in a section not serving as a product of the first intermediate laminate in step 2 above, and filling of the hole (H) with the insulating material (J) in step 3 enables to enhance the peeling strength at the end portion of the laminate and the periphery thereof (hereinafter, referred to as "circumference section"), into which the chemical agent easily penetrates in the treatment with a chemical agent in step 4, in the interface (hereinafter, also referred to as "peeling surface" in the present specification.) between the carrier substrate (G) to be removed in step 5 and the metal layer (M). Therefore, penetration of the chemical agent into the circumference section can be suppressed to result in making of a laminate having a good appearance and having a more uniform thickness of the metal layer (M). In addition, in a treatment where the third intermediate laminate is immersed sequentially in chemical agents in a plurality of chemical agent tanks, such chemical agents conventionally have penetrated into the third intermediate laminate to thereby easily contaminate the chemical agent in the chemical agent tank for the next chemical agent treatment, but, in the present embodiment, penetration of the chemical agents can be suppressed to thereby suppress such contamination.

A method for producing the laminate of the present embodiment may also include a step of providing a second hole (T) for alignment (hereinafter, referred to as an "alignment hole (T)".) between step 3 and step 4 above. In such a case, the chemical agent can be caused to penetrate into the second alignment hole (T) and the periphery thereof due to the same factor as in the circumference section of the laminate. Therefore, in step 2, the hole (H) is preferably provided in a section not serving as a product, the section being located at a position closer to the end portion of the laminate than the end portion of the alignment hole (T) and a position closer to the end portion of the alignment hole (T) than the end portion of the laminate or equidistant from these end portions (namely, a position intermediate between the end portion of the laminate and the end portion of the alignment hole (T), and/or a position closer to the end portion of the alignment hole (T) than the end portion of the laminate). Examples of the laminate having the alignment hole (T) include the following laminate. That is, in circuit pattern formation in step 4 such as treatment 4c described later, examples include a laminate where an alignment hole (T) with a circuit pattern on an inner layer is formed by an X-ray hole punching machine, and a laminate where an alignment hole (T) for exposure is formed by hole punching with a drill.

In such a laminate, the hole (H) provided at a position closer to the end portion of the laminate than the end portion of the alignment hole (T) can be filled with the insulating material to thereby suppress penetration of the chemical agent mainly in the circumference section of the laminate, and the hole (H) provided at a position closer to the end portion of the alignment hole (T) than the end portion of the laminate or equidistant from these end portions can be filled with the insulating material to thereby suppress penetration of the chemical agent mainly in the alignment hole (T) and the periphery thereof. That is, not only the circumference section of the laminate, but also the alignment hole (T) and the periphery thereof can be subjected to formation of the hole (H) in step 2 and filling of the hole (H) with the insulating material in step 3 to thereby enhance the peeling strength at the circumference section of the laminate, into which the chemical agent in the chemical agent treatment in step 4 easily penetrates, and at the alignment hole (T) and the periphery thereof in the interface (peeling surface) between the carrier substrate (G) to be removed in step 5 and the metal layer (M). Therefore, penetration of the chemical agent into such a section can be suppressed to result in making of a laminate having a good appearance and having a more uniform thickness of the metal layer (M). In addition, in a treatment where the third intermediate laminate is immersed sequentially in chemical agents in a plurality of chemical agent tanks, penetration of the chemical agents can also be suppressed to thereby suppress chemical agent contamination in the chemical agent tank for the next chemical agent treatment.

Step 4 of treatment with a chemical agent is not particularly limited, and examples thereof include steps 4a, 4b and 4c below. A metal corrosive chemical agent is used in such steps. Therefore, when such a chemical agent penetrates into the interface between the carrier substrate (G) and the metal layer (M), appearance is easily poor and/or the thickness of the metal layer (M) is easily ununiform. If appearance is poor and/or the thickness of the metal layer (M) is ununiform, the amounts of a printed wiring board and a substrate for mounting a semiconductor device to be produced per laminate are decreased. The method for producing the laminate of the present embodiment may include performing one step of steps 4a, 4b and 4c once or more times as step 4, or may include a combination of two or more steps of steps 4a, 4b and 4c.

Step 4a: a step of removing a smear generated in formation of a non-through hole (R) by laser processing.

Step 4b: a step of plating the surface of the metal foil.

Step 4c: a step of forming a circuit pattern from the metal foil by a subtractive method.

The laminate of the present embodiment may also be produced by a production method including the following steps A to C among steps 1 to 4 above, after step 4 (provided that step 5 is not included), or between step 4 and step 5. Here, the laminate may be produced through one step of steps A to C once or more times, or may be produced by a combination of two or more steps of steps A to C.

Step A: a step of stacking and disposing an insulating material (K) and a metal foil in this order on any of the intermediate laminated bodies or the laminate, and pressurizing them in the stacking direction thereof with heating to allow the insulating material (K) and the metal foil to adhere to the intermediate laminate or laminate.

Step B: a step of pattern plating the metal layer (M) on any of the intermediate laminate surfaces or the laminate surface to form a circuit pattern.

Step C: a step of forming a circuit pattern from the metal foil included in any of the intermediate laminated bodies by a subtractive method.

Herein, step B and C are different from step 4 (step 4b, step 4c) in that these are provided before step 3.

For example, a laminate of the present embodiment obtained by a method for producing an embedded trace coreless substrate (embedded trace coreless process) can be made sequentially through step 1, step 2, step B, step 3, step 4 (step 4a), step 4 (step 4b) and step 4 (step 4c), and can also be made further through step 5 after step 4 (step 4c). An alignment hole (T) may also be here, if necessary, provided in any step between step 3 and step 4, and a hole (H) may also be provided at the periphery (a position closer to the end portion of the hole (T) than the end portion of the laminate or equidistant from these end portions) of the alignment hole (T) in step 2.

In addition, a laminate of the present embodiment obtained by a method for producing a three-layered coreless substrate (three-layered coreless process) can be made sequentially through step 1, step 2, step 3, step 4 (step 4c) and step A, and can also be made further through step 5 after step A. An alignment hole (T) may also be here, if necessary, provided in any step between step 3 and step 4, and a hole (H) may also be provided at the periphery (a position closer to the end portion of the hole (T) than the end portion of the laminate or equidistant from these end portions) of the alignment hole (T) in step 2.

In addition, a laminate of the present embodiment obtained by a method for producing a four-layered coreless substrate (four-layered coreless process) can be made sequentially through step 1, step A, step 2, step C, step 3, step 4 (step 4a), step 4 (step 4b), step 4 (step 4c) and step A, and can also be made further through step 5 after last step A. An alignment hole (T) may also be here, if necessary, provided in any step between step 3 and step 4, and a hole (H) may also be provided at the periphery (a position closer to the end portion of the hole (T) than the end portion of the laminate or equidistant from these end portions) of the alignment hole (T) in step 2.

Hereinafter, steps 1 to 5 that prepare the laminate of the present embodiment are described in more detail.

[Step 1]

In step 1, a first intermediate laminate provided with a carrier substrate (G) including a support (F) therein and a metal layer (M) formed on at least one surface of the carrier substrate (G), the metal layer (M) being peelable in step 5 described later, is provided. Specifically, the first intermediate laminate may be made by forming a metal layer (M) having a peeling surface between the carrier substrate (G) and the metal layer (M), on one surface or both surfaces of the carrier substrate (G).

The "carrier substrate (G)" refers to a core substrate to be peeled and removed from the laminate of the present embodiment in step 5. The first intermediate laminate provided in step 1 is a laminate with the metal layer (M) formed on the carrier substrate (G) to be peeled and removed in step 5. The carrier substrate (G) may be a single layer including only the support (F), or may have at least one layer other than the support (F) as long as the function of the support (F) is not impaired. Examples of the layer other than the support (F) in the carrier substrate (G) include a release layer (L)

having a surface in contact with the metal layer (M) of the carrier substrate (G), the release layer (L) being provided in order to adjust the peeling strength at the interface between the carrier substrate (G) and the metal layer (M) within a preferable range described later, and an adhesion layer that allows the release layer (L) to adhere to the support. In addition, when the carrier substrate has the layer other than the support (F), the material of the layer is not particularly limited, and may be a conductive or insulating material. Examples of the material include metals such as copper and aluminum, insulating materials such as polyimide, an epoxy resin, an acrylic resin, polytetrafluoroethylene (PTFE) and a bismaleimide triazine resin (BT resin), and prepregs in which paper, glass fiber woven fabric, a carbon fiber, or glass nonwoven fabric is impregnated with the insulating material. When the carrier substrate (G) includes a plurality of layers, the layer configuration is not particularly limited, and examples include a configuration where a conductive layer and the support (F) are stacked in this order, a configuration where a conductive layer, the support (F) and a conductive layer are stacked in this order, a configuration where a conductive layer, an insulating layer and the support (F) are stacked in this order, a configuration where a conductive layer, an insulating layer, the support (F), an insulating layer and a conductive layer are stacked in this order, a configuration where an insulating layer, a conductive layer and the support (F) are stacked in this order, and a configuration where an insulating layer, a conductive layer, the support (F), a conductive layer and an insulating layer are stacked in this order.

The thickness of the carrier substrate (G) is not particularly limited, and is preferably 30 to 250 μm, more preferably 60 to 200 μm. When the thickness of the carrier substrate (G) is 30 μm or more, the carrier substrate (G) has sufficient rigidity for formation of the metal layer (M), an insulating material layer and the like, and when the thickness is 250 μm or less, economic efficiency is higher.

The kind of the metal of the metal layer (M) is not particularly limited, and at least one selected from, for example, gold, silver, copper, aluminum, and an alloy of two or more of such metals can be used. Among them, copper is suitably used in terms of thermal expansion rate, conductivity and economic efficiency.

The thickness of the metal layer (M) is not particularly limited, and is preferably 20 μm or less, more preferably 10 μm or less, particularly preferably 1 to 5 μm. The thickness of the metal layer (M) is preferably 20 μm or less from the viewpoints of higher economic efficiency and productivity of the laminate.

The peeling strength at the interface between the carrier substrate (G) and the metal layer (M) is not particularly limited, and is preferably 1 to 50 N/m, more preferably 3 to 40 N/m, further preferably 5 to 10 N/m. When the peeling strength is 1 N/m or more, penetration of a chemical agent into the interface between the carrier substrate (G) and the metal layer (M) can be effectively suppressed by punching of a hole (H) in step 2 and filling of the hole (H) with an insulating material (J) in step 3. In addition, when the peeling strength is 50 N/m or less, peeling unevenness of the metal layer (M) more hardly occurs in peeling of the laminate from the carrier substrate (G) in step 5. The peeling strength can be adjusted within the above range by selecting the material of the surface in contact with the metal layer (M) of the carrier substrate (G), and if necessary subjecting the surface in contact with the metal layer (M) of the carrier substrate (G) to a surface treatment in consideration of the material and the surface state of the metal layer (M). Alternatively, at least one layer selected from the group consisting of an adhesion layer and a release layer can be provided between the carrier substrate (G) and the metal layer (M) to adjust the peeling strength within the above range.

The support (F) imparts to the carrier substrate (G) rigidity that can allow a thin printed wiring board, a substrate for mounting a semiconductor device, and the like to be produced from the laminate of the present embodiment even in the existing production apparatus. In addition, the support (F) allows penetration of a chemical agent into the interface between the carrier substrate and the peelable metal layer to be suppressed by formation of a hole (H) on the support (F) in step 2 and filling of the hole (H) with an insulating material (J) in step 3. The support (F) is not particularly limited and is usually sheet-shaped, and for example, a metal substrate and/or an insulating material (S) can be used. When a metal substrate is used as the support (F), the metal substrate is a substrate including a metal, and the kind of the metal in the metal substrate is not particularly limited. Examples of the kind of the metal include aluminum, stainless steel, copper, iron, titanium and an alloy thereof. For example, the metal substrate and/or an insulating material (S) can be used as the support (F), and when only the support (F) is used as the carrier substrate (G), the support (F) is more preferably an insulating material (S) described later in terms of the difference in thermal expansion rate from the metal layer (M), and peeling strength and economic efficiency. In addition, even when a carrier substrate (G) where other material such as a release layer (L) including an organic film described later is stacked on the support (F) is used, an insulating material (S) described later is more preferable in terms of the difference in thermal expansion rate from such other material, and peeling strength and economic efficiency.

The thickness of the support (F) is not particularly limited, and is preferably 5 to 200 μm, more preferably 15 to 150 μm. When the thickness of the support (F) is 5 μm or more, a carrier substrate (G) higher in rigidity can be made, and when the thickness is 200 μm or less, economic efficiency is higher.

The insulating material (S) that can be used in the support (F) is not particularly limited, and examples thereof include a glass substrate, an organic film substrate and a prepreg. The glass substrate is a substrate including glass, and when the glass substrate is used, the material of the glass and the kind of the glass are not particularly limited and glass such as alkali silicate-based glass, non-alkaline glass and quartz glass can be used. In addition, the organic film substrate is a substrate including an organic film, and when the organic film substrate is used, the material of the organic film is not particularly limited. As the organic film, for example, a polyamide film, a polyimide film, a polyethylene film, a polypropylene film, a polyester film, a polyethylene terephthalate film (PET film), a polybutylene terephthalate film (PBT film), a polyvinyl chloride film, a polyvinyl alcohol-based film, a polystyrene film, a polyvinylidene chloride film, and a polyvinylidene oxide film can be used. These may be used singly or in combinations of two or more. Examples of the insulating material (S) that can be used in the support (F) include the glass substrate, the organic film substrate and a prepreg. These may be used singly or in combinations of two or more. Among them, as the insulating material (S), an insulating material other than the glass substrate is more preferable in terms of hole-punching processability, and a prepreg described later in detail is further preferable in terms of thermal expandability and heat resistance.

The "prepreg" refers to a material where a resin composition is added and attached to a fibrous reinforcing material such as a glass fiber and an organic fiber. The prepreg that can be used in the support (F) is not particularly limited, and examples include one including the following resin composition and fibrous reinforcing material. Examples of the resin composition that can be used in the prepreg include a composition including at least one resin selected from the group consisting of an epoxy resin, a cyanate resin, a bismaleimide resin, a bismaleimide triazine resin, a polyimide resin, a polyphenylene ether resin, a phenol resin, a melamine resin, a polyurethane resin and a polyester resin. These may be used singly or as a mixture of two or more. Examples of the fibrous reinforcing material include glass fibers (such as E glass, D glass, S glass, NE glass, T glass and Q glass), inorganic fibers including quartz or the like, organic fibers including polyimide, polyamide, polyester or the like, a carbon fiber, and a cellulose fiber. These can be appropriately selected depending on the intended use and performance, and may be used singly or in combinations of two or more. Examples of the form of the fiber reinforcing material include forms of woven fabric, nonwoven fabric, roving, a chopped strand mat, and a surfacing mat. In addition, the resin composition for use in the prepreg may also include an inorganic filler. Examples of the inorganic filler include silica such as natural silica, fused silica, amorphous silica and hollow silica, aluminum compounds such as boehmite, aluminum hydroxide and alumina, magnesium compounds such as magnesium oxide and magnesium hydroxide, calcium compounds such as calcium carbonate, molybdenum compounds such as molybdenum oxide and zinc molybdate, talc such as natural talc and fired talc, mica (isinglass), and glass such as short fiber glass, spherical glass and fine powder glass (E glass, T glass, D glass and the like). These may be used singly or in combinations of two or more.

Among them, at least one selected from the group consisting of silica, aluminum hydroxide, boehmite, magnesium oxide and magnesium hydroxide is preferable as the inorganic filler, a resin composition of a bismaleimide triazine resin (BT resin) is preferable as the resin composition, and glass fiber woven fabric is preferable as the fibrous reinforcing material, from the viewpoints of insulation reliability, adhesion strength to the metal layer (M) and the metal foil, wiring formation properties, heat resistance, moisture absorption resistance, rigidity, and electric properties. From the same viewpoints, as the prepreg, a prepreg is particularly preferable where glass fiber woven fabric is impregnated with a resin composition of a bismaleimide triazine resin (BT resin), the composition including, as the inorganic filler, at least one selected from the group consisting of silica, aluminum hydroxide, boehmite, magnesium oxide and magnesium hydroxide, and the resultant is B-staged.

The form of the first intermediate laminate provided in step 1, namely, the form of the first intermediate laminate with the metal layer (M) formed on the carrier substrate (G) to be peeled and removed in step 5 is not particularly limited. Examples of the form include a form where a peelable metal layer (M) is directly formed on the support (F) included in the carrier substrate (G), a form where a peelable metal layer (M) is formed on the carrier substrate (G) provided with the support (F) and the release layer (L) including an organic film provided thereon, and a form where a metal foil with a carrier metal foil is directly stacked on the support (F) so that the carrier metal foil faces the support (F). Among them, a form where a metal foil with a carrier metal foil is directly stacked on the support (F) so that the carrier metal foil faces the support (F) is preferable because it can be more simply used and can allow the thickness of the metal layer (M) to be more easily thinner.

Herein, the "metal foil with a carrier metal foil" refers to a laminate sheet provided with a carrier metal foil and a metal foil (hereinafter, referred to as a "thin metal foil".) thinner than the carrier metal foil. In more detail, the metal foil with a carrier metal foil is a laminated sheet where a thin metal foil is stacked on a carrier metal foil in a peelable manner, if necessary, with another film interposed therebetween, and may be a commercially available product. In the form where the metal foil with a carrier metal foil is directly stacked on the support (F), the following portions correspond to the carrier substrate (G) and the metal layer (M), respectively. That is, when the metal foil with a carrier metal foil is a laminated sheet formed by stacking a carrier metal foil and a thin metal foil, the carrier metal foil and the thin metal foil are to be peeled and therefore a portion including the support (F) and the carrier metal foil corresponds to the carrier substrate (G) and the thin metal foil corresponds to the metal layer (M). In addition, when the metal foil with a carrier metal foil is a laminated sheet where a carrier metal foil, another film layer and a thin metal foil are stacked in this order and the peeling strength at the interface between the carrier metal foil and another film layer is higher than the peeling strength at the interface between another film layer and the thin metal foil, another film layer and the thin metal foil are to be peeled and therefore a portion including the support (F) and the carrier metal foil corresponds to the carrier substrate (G) and the thin metal foil corresponds to the metal layer (M). Furthermore, when the metal foil with a carrier metal foil is a laminated sheet where a carrier metal foil, another film layer and a thin metal foil are stacked in this order and the peeling strength at the interface between the carrier metal foil and another film layer is lower than the peeling strength at the interface between another film layer and the thin metal foil, the carrier metal foil and another film layer are to be peeled. In such a case, however, the carrier metal foil is peeled and thereafter another film layer is peeled from the thin metal foil, and therefore a portion including the support (F), the carrier metal foil and another film layer corresponds to the carrier substrate (G) and the thin metal foil corresponds to the metal layer (M). In such a case, while a chemical agent easily penetrates into both of the interface between the carrier metal foil and another film layer and the interface between another film layer and the thin metal foil, the present embodiment can also allow penetration of a chemical agent into both the interfaces to be suppressed.

The method for making the laminate provided with the carrier substrate (G) and the metal layer (M) formed on the substrate (G) is not particularly limited. Examples of the method for making the same include a method for forming the peelable metal layer (M) on one surface or both surfaces of the support (F) included in the carrier substrate (G), a method for forming the metal layer (M) on the carrier substrate (G) with the release layer (L) including an organic film on one surface or both surfaces of the support (F), and a method of laminating the metal foil with a carrier metal foil on one surface or both surfaces of the support (F). Among them, a method of laminating the metal foil with a carrier metal foil on one surface or both surfaces of the support (F) is simple and therefore preferable.

When a peelable metal layer (M) is formed on the support (F) to provide the first intermediate laminate made in step 1, the metal layer (M) may be formed on only one surface or both surfaces of the support (F), and is preferably formed on both surfaces thereof. The reason is because the metal layer (M) is formed on both surfaces to thereby result in an enhancement in productivity of the laminate of the present embodiment. Herein, when the metal layer (M) is formed on both surfaces of the support (F), the kinds of the metals of the metal layers (M) may be mutually the same or different.

The method for forming the metal layer (M) on the support (F) is not particularly limited. Examples of the method include a method of metal plating the support (F), a method of laminating metal foil on the support (F), a method of vapor-depositing a metal on the support (F), and a method of sputtering a metal on the support (F). Among them, a method of laminating a metal foil on the support (F) is simple and therefore preferable.

The kind of the metal of the metal foil may be the same as the kind of the metal of the metal layer (M). As such a metal foil, for example, a commercially available product such as GHY5 (trade name, copper foil of 12 μm thickness) produced by JX Nippon Mining & Metals Corporation and 3EC-III (trade name, copper foil of 18 μm thickness) produced by Mitsui Mining & Smelting Co., Ltd. can also be used. In addition, an adhesion layer for adhesion of the metal foil and the support (F) may also be provided therebetween, and a metal foil with an adhesion layer may also be used. The material of the adhesion layer is not particularly limited, and for example, an acrylic resin, an epoxy-based resin, a polyimide-based resin and a polyester-based resin can be used.

When the peelable metal layer (M) is formed on the carrier substrate (G) with the release layer (L) including an organic film formed on the support (F) to provide the first intermediate laminate made in step 1, the material of the organic film that can be used in the release layer (L) is not particularly limited. Examples of the material include a polyamide film, a polyimide film and a polyester film. Among them, a polyimide film is preferable in terms of peelability and heat resistance. The thickness of the release layer (L) is not particularly limited, and is preferably 20 μm or less because of being high in economic efficiency. Herein, the lower limit of the thickness of the release layer (L) is not particularly limited, and may be, for example, 1 μm or more.

While the release layer (L) may be formed on only one surface or both surfaces of the support (F), it is preferably formed on the both surfaces. The reason is because the release layer (L) is formed on the both surfaces to thereby result in an enhancement in productivity of the laminate of the present embodiment. Herein, when the release layer (L) including an organic film is formed on both surfaces of the support (F), the kinds of the organic films may be mutually the same or different.

The method for forming the release layer (L) including an organic film formed on the support (F) is not particularly limited. As such a method, for example, a method including coating the support (F) with a solution where the material forming the organic film is dissolved in a solvent, and thereafter drying the resultant, a method including disposing the organic film on the support (F) and heat-welding the resultant by pressing, and a method including allowing the support (F) and the organic film to adhere to each other by an adhesive can be used. Among them, a method including disposing the organic film on the support (F) and heat-welding the resultant by pressing is simple and therefore preferable.

The method for forming the metal layer (M) on the release layer (L) is not particularly limited. As such a method, for example, a method including metal plating the release layer (L), a method including laminating a metal foil on the release layer (L), a method including vapor-depositing a metal on the release layer (L), and a method including sputtering a metal on the release layer (L) can be used. Among them, a method including laminating a metal foil on the release layer (L) is simple and therefore preferable.

In particular, a method including disposing an organic film as the release layer (L) and a metal foil as the metal layer (M) on the support (F) and laminating the resultant at one time is particularly simple and therefore preferable as the method for forming the release layer (L) including an organic film and the metal layer (M) on the support (F).

When the metal foil with a carrier metal foil is laminated on the support (F) to provide the first intermediate laminate made in step 1, the kind of the metal of each of the carrier metal foil and the metal foil thinner than the carrier metal foil is not particularly limited. Examples of the kind of such a metal foil include gold, silver, copper, aluminum, nickel, iron, chromium, manganese, molybdenum, and an alloy including 90% or more in total of at least one selected from alloys of two or more of such metals. In particular, copper is most preferable in terms of thermal expansion rate, conductivity and economic efficiency. In addition, when the metal foil with a carrier metal foil is provided with another film layer above, the material of such another film layer is not particularly limited, and examples include polyimide, polyamide, polytetrafluoroethylene (PTFE), an acrylic resin, polyethylene terephthalate, a silicone resin, polybutylene terephthalate (PBT), an aramid resin, a urea resin, cellophane, polysulfone, an ethylene propylene diene rubber (EPDM), polyester, polyethylene, polypropylene, polyester, nylon, polycarbonate, a phenol resin, a BT resin, triacetate, an epoxy resin, polyphenylene sulfide, a liquid crystal polymer (LCP), polyethylene naphthalate and polyvinyl chloride (PVC).

In the metal foil with a carrier metal foil, the thickness of the carrier metal foil is not particularly limited, and is preferably 9 to 70 μm, more preferably 12 to 35 μm. When the thickness of the carrier metal foil is 9 μm or more, the metal foil with a carrier metal foil is more easily handled, and when the thickness is 70 μm or less, economic efficiency is higher. The thickness of the thin metal foil is not particularly limited, and is preferably 5 μm or less, more preferably 1 to 5 μm. When the thickness of the thin metal foil is 5 μm or less, economic efficiency is higher and productivity of the laminate is also high. When the metal foil with a carrier metal foil is provided with another film layer above, the thickness of another film layer above is not particularly limited, and is preferably 0.01 to 100 μm, more preferably 1 to 10 μm. The thickness of such another film layer is 0.01 μm or more to thereby allow peelability to be better, and the thickness is 100 μm or less to thereby allow economic efficiency to be higher.

The peeling strength at the interface between the carrier metal foil and the thin metal foil is not particularly limited, and is preferably 1 to 50 N/m, more preferably 3 to 40 N/m, further preferably 5 to 10 N/m. When the peeling strength is 1 N/m or more, penetration of a chemical agent into the interface between the carrier substrate (G) and the metal layer (M), namely, the interface between the carrier metal foil and the thin metal foil can be more effectively suppressed by punching of a hole (H) in step 2 and filling of the hole (H) with an insulating material in step 3. In addition, when the peeling strength is 50 N/m or less, peeling unevenness of the thin metal foil in peeling and removing of the carrier substrate (G) from a third intermediate laminate in step 5 is more hardly caused. The method of measuring the peeling strength is as follows. First, a prepreg (trade name "GHPL-830NS SN74", 45 μm thickness) produced by Mitsubishi Gas Chemical Company, Inc. and the metal foil with a carrier metal foil are stacked on both surface of a copper-clad laminated plate (trade name "CCL-HL832NS 0.2t T/T", 0.2 mm thickness) produced by Mitsubishi Gas Chemical Company, Inc. so that the carrier metal foil faces outwards, and subjected to vacuum hot pressing in conditions of 220° C. and 3 MPa for 2 hours to prepare a laminated plate. The laminated plate made is cut to a width of 5 cm, the carrier metal foil is peeled at room temperature (23° C.) by an autograph or a spring scale, and the peeling strength here is measured.

In addition, when the metal foil with a carrier metal foil includes another film layer above, a lower peeling strength of the peeling strength at the interface between the carrier metal foil and another film layer and the peeling strength at the interface between another film layer and the thin metal foil is preferably 1 to 50 N/m, more preferably 3 to 40 N/m, further preferably 5 to 10 N/m from the same viewpoints as above. In addition, a higher peeling strength thereof is not particularly limited, and is for example, 10 to 100 N/m.

As such a metal foil with a carrier metal foil, for example, a commercially available product such as MT18Ex (trade name, 5 μm thin copper foil) produced by Mitsui Mining & Smelting Co., Ltd. can be used. In addition, an adhesion layer may be provided between the metal foil with a carrier metal foil and the support (F), and a metal foil with a carrier metal foil, with an adhesion layer, may be used. The material of the adhesion layer is not particularly limited, and for example, an acrylic adhesive and an epoxy-based adhesive can be used therefor.

While the metal foil with a carrier metal foil may be laminated on only one surface or both surfaces of the support (F), it is preferably laminated on both surfaces thereof. The reason is because the metal foil with a carrier metal foil is laminated on the both surfaces to result in an enhancement in productivity of the laminate of the present embodiment. Herein, when the metal foil with a carrier metal foil is laminated on both surfaces of the support (F), the kinds of the metals of the metal foil with a carrier metal foil may be mutually the same or different.

The method for laminating the metal foil with a carrier metal foil on the support (F) is not particularly limited. Examples of the method include a method including stacking the metal foil with a carrier metal foil and the support (F), and thereafter pressurizing them in the stacking direction thereof under vacuum (reduced pressure) with heating, and the method further including allowing them to adhere with an adhesive or an adhesion sheet. Among them, a method including stacking the metal foil with a carrier metal foil and the support (F), and thereafter pressurizing them in the stacking direction thereof under vacuum (reduced pressure) with heating is simple and therefore preferable as the method for laminating the metal foil with a carrier metal foil on the support (F). The support (F) is preferably a prepreg from such a viewpoint.

Accordingly, examples of the first intermediate laminate provided in step 1 include a laminate obtained by metal plating one surface or both surfaces of one or a stacked product of two or more selected from the group consisting of a metal substrate, a glass substrate, an organic film substrate and a prepreg; a laminate obtained by laminating a metal foil on one surface or both surfaces of one or a stacked product of two or more selected from the group consisting of a metal substrate, a glass substrate, an organic film substrate and a prepreg; a laminate obtained by stacking an organic film and a metal foil on one surface or both surfaces of one or a stacked product of two or more selected from the group consisting of a metal substrate, a glass substrate, an organic film substrate and a prepreg; and a laminate obtained by laminating a metal foil with carrier metal foil on one surface or both surfaces of one or a stacked product of two or more selected from the group consisting of a metal substrate, a glass substrate, an organic film substrate and a prepreg. Among them, a laminate obtained by laminating a metal foil on one surface or both surfaces of a prepreg, and a laminate obtained by laminating a metal foil with a carrier metal foil on one surface or both surfaces of a prepreg are particularly preferable in terms of productivity and simplicity.

[Step 2]

In step 2, a hole (H) reaching at least the support (F) in the carrier substrate (G) from the surface of the first intermediate laminate is formed in a section not serving as a product of the first intermediate laminate provided in step 1, to prepare a second intermediate laminate with the hole (H). The reason why the hole (H) is formed in step 2 is as follows. That is, in step 3 after step 2, an insulating material (J) and a metal foil are disposed on the second intermediate laminate with the hole (H), and pressurized in the stacking direction thereof with heating. Thus, the insulating material (J) serves to come into the hole (H) to mutually secure the carrier substrate (G) and the metal layer (M). As a result, the peeling strength at the peeling surface is increased, and therefore, when treatment with a chemical agent such as desmear is conducted in step 4 described later, the chemical agent is prevented from penetrating into the peeling surface.

The "section not serving as a product" herein refers to a section to be cut and removed from the laminate in production of a substrate for mounting a semiconductor device or a printed wiring board from the laminate of the present embodiment, and the section corresponds to a section not constituting a substrate for mounting a semiconductor device and a printed wiring board as final products.

The section not serving as a product of the first intermediate laminate, where the hole (H) is formed, is, for example, a part or all of the circumference section (end portion and the periphery thereof) of the first intermediate laminate, and the section corresponds to a part or all of the circumference section of the laminate according to the present embodiment. For example, when the shape of the laminate is quadrate (for example, rectangular), the hole (H) is preferably formed on each of four corners of the laminate. The reason is because the chemical agent more easily penetrates through four corners of the laminate, where the peeling strength between the carrier substrate (G) and the metal layer (M) is easily low.

The position where the hole (H) is formed is preferably located at a distance of 50 mm or less from the end portion of the first intermediate laminate in a part or all of the periphery of the end portion of the first intermediate laminate, more preferably at a distance of 0.1 mm to 30 mm from the end portion of the first intermediate laminate, further preferably at a distance of 1 mm to 10 mm from the end portion of the laminate. When the position where the hole (H) is formed is located at a distance of 50 mm or less from the end portion of the laminate in a part or all of the circumference section of the laminate, it is possible in a chemical agent treatment in step 4 to sufficiently prevent penetration of the chemical agent. Herein, the size of the first intermediate laminate may be any size that can allow the hole (H) to be formed at the above position, and for example, when the planar shape (shape when viewed from the stacking direction) of the first intermediate laminate is quadrate (for example, rectangular), a quadrate having each side of 100 mm or more in length is preferable, and a quadrate having each side of 300 mm to 800 mm in length is more preferable. Herein, the sizes of the second intermediate laminate, the third intermediate laminate and the laminate of the present embodiment may be the same as the size of the first intermediate laminate.

The "distance" herein means the shortest length connecting two points. For example, the distance between the end portion of one of the first (or second) intermediate laminate and the end portion of one of the hole (H) corresponds to the length of a straight line obtained by determining points (two points including a point at the end portion of the intermediate laminate and a point at the end portion of the hole (H)) at the respective end portions so that the shortest length between the respective end portions is achieved, and connecting such two points.

In the method for producing the laminate of the present embodiment, a step of providing an alignment hole (T) may be provided between step 3 and step 4 for the purpose of alignment for exposure or laser processing for formation of a circuit pattern. In this case, the hole (H) is preferably provided at the periphery of the alignment hole (T). More particularly, not only a hole (H) provided at a position closer to the end portion of the laminate than the end portion of the alignment hole (T), but also a hole (H) at a position closer to the end portion of the alignment hole (T) than the end portion of the laminate or equidistant from these end portions is preferably provided. More specifically, the position of the hole (H) provided at the periphery of the alignment hole (T) is preferably a position located at a distance of 50 mm or less from the end portion of the hole (T), more preferably at a distance of 0.1 mm to 30 mm from the end portion of the hole (T), further preferably at a distance of 1 mm to 10 mm from the end portion of the hole (T). When the position where the hole (H) is formed is a position located at a distance of 50 mm or less from the end portion of the hole (T), it is possible in a chemical agent treatment in step 4 to further sufficiently prevent penetration of the chemical agent due to the hole (T).

The depth of the hole (H) is required to be a depth so that at least the hole (H) reaches the support (F) in the carrier substrate (G). When the depth of the hole (H) reaches the support (F) in the carrier substrate (G), the insulating material (J) comes into the hole (H) in step 3, resulting in an increase in peeling strength at the peeling surface. As a result, penetration of the chemical agent in the chemical agent treatment due to the peeling surface can be sufficiently prevented. That is, the hole (H) may be a hole (through hole) that passes through the first (second) intermediate laminate, or may be a non-through hole (cut hole) that reaches the support (F) from the first (second) laminate surface.

The size of the hole (H) is not particularly limited, and the cross-sectional area of the hole (H) when viewed from the second intermediate laminate surface (namely, the area of any cross section perpendicular to the stacking direction of the second intermediate laminate) is preferably 0.002 mm$^2$ or more and 8 mm$^2$ or less, more preferably 0.005 mm$^2$ or more and 4 mm$^2$ or less. When the cross-sectional area of the hole (H) is 0.002 mm$^2$ or more, the peeling strength at the peeling surface is higher and therefore it is possible in a chemical agent treatment in step 4 to further sufficiently prevent penetration of the chemical agent. In addition, when the cross-sectional area is 8 mm$^2$ or less, peeling unevenness of the metal layer (M) on a laminate surface obtained in peeling of the carrier substrate (G) from the third intermediate laminate more hardly occurs.

The shape of the hole (H) is not particularly limited, and may be any shape such as round, elliptical, square, oblong and hexagonal shapes when viewed from the second intermediate laminate surface. In addition, the shape of the cross section in parallel with the stacking direction of the second intermediate laminate, of the hole (H), is not particularly limited, and may be any shape such as square, oblong and trapezoidal shapes.

The number of the holes (H) in the second intermediate laminate is not particularly limited, and is preferably 3 or more per 100 mm square, more preferably 5 or more per 100 mm square. When the number of the holes (H) is 3 or more per 100 mm square, the peeling strength at the peeling surface is higher, and therefore it is possible in a chemical agent treatment in step 4 to further sufficiently prevent penetration of the chemical agent.

The method for forming the hole (H) is not particularly limited, and for example, a method for punching a hole by a drill and a method for punching a hole by laser can be used. In particular, a hole punching method with an NC drilling machine that can punch a hole with the position coordinate being fixed is preferable because of being capable of economically producing a printed wiring board and a substrate for mounting a semiconductor device having a fine wiring structure.

[Step 3]

In step 3, an insulating material (J) and a metal foil are stacked and disposed on a surface where the hole (H) is formed of the second intermediate laminate with the hole (H) made in step 2, in this order when viewed from the surface, and pressurized in the stacking direction thereof with heating, to prepare a third intermediate laminate where the hole (H) is filled with the insulating material (J). In step 3, the insulating material (J) comes into the hole (H) to resulting in an increase in peeling strength at the peeling surface, as described above. As a result, when treatment with a chemical agent such as desmear in step 4 described later is conducted, penetration of the chemical agent into the peeling surface is prevented.

The insulating material (J) is an insulating material that can flow at the heating temperature in step 3, and is preferably an insulating material other than the glass substrate of the insulating material (S). Examples of the insulating material (J) include an organic film substrate and a prepreg. Among them, a prepreg is preferable because it is highly rigid and much higher in insulation reliability, and it can allow the peeling strength at the interface between the carrier substrate (G) and the metal layer (M), in filling of the hole (H) therewith, to be more properly adjusted. As the material of the organic film of the organic film substrate, any material which is described with respect to the organic film substrate and which can be used as the insulating material (S) can be used. As the prepreg that can be used as the insulating material (J), any prepreg described above, which can be used as the support (F), can be used.

The thickness of the insulating material (J) is not particularly restricted, and is preferably 5 to 200 µm, more preferably 5 to 150 When the thickness of the insulating material (J) is 5 µm or more, rigidity and insulation reliability are higher, and when the thickness is 200 µm or less, forming of the non-through hole (R) by laser processing and metal plating of the non-through hole (R) are more easily conducted, and economic efficiency is much higher.

The kind of the metal of the metal foil is not particularly limited, and for example, at least one selected from gold, silver, copper, aluminum, and an alloy of two or more of such metals thereof can be used. Among them, copper is suitably used in terms of thermal expansion rate, conductivity and economic efficiency.

The thickness of the metal foil is not particularly restricted, and is preferably 1 to 70 μm, more preferably 1.5 to 35 μm. When the thickness of the metal foil is 1 μm or more, handling is easier, and when the thickness is 70 μm or less, economic efficiency is higher.

As such a metal foil, a commercially available product such as JDLC (trade name, copper foil of 12 μm thickness) produced by JX Nippon Mining & Metals Corporation and 3EC-III (trade name, copper foil of 18 μm thickness) produced by Mitsui Mining & Smelting Co., Ltd. can be used. In addition, an adhesion layer may be provided between the metal foil and the insulating material (J), and a metal foil with an adhesion layer may also be used. The material of the adhesion layer is not particularly limited, and an acrylic resin, an epoxy-based resin, a polyimide-based resin and a polyester-based resin can be used.

The heating and pressurizing treatment method is not particularly limited, and examples can include vacuum (reduced pressure) hot pressing and vacuum (reduced pressure) lamination. Among them, vacuum (reduced pressure) hot pressing is preferable because it can more increase the adhesion strength in use of a prepreg as the insulating material (J).

The heating temperature is not particularly limited, and is preferably 180 to 230° C., more preferably 210 to 220° C. When the heating temperature is 180 to 230° C., the second intermediate laminate with the hole (H), the insulating material (J) and the metal foil more sufficiently adhere, and the hole (H) is also further sufficiently filled with the insulating material (J).

The pressurizing pressure is not particularly limited, and is preferably 1 to 4 MPa, more preferably 2.5 to 3.5 MPa. When the pressurizing pressure is 1 to 4 MPa, the second intermediate laminate with the hole (H), the insulating material (J) and the metal foil more sufficiently adhere, and the hole (H) is also further sufficiently filled with the insulating material (J).

The heating and pressurizing treatment time is not particularly limited, and is preferably 60 to 300 minutes, more preferably 120 to 180 minutes. When the heating and pressurizing treatment time is 60 to 300 minutes, the second intermediate laminate with the hole (H), the insulating material (J) and the metal foil more sufficiently adhere, and the hole (H) is also further sufficiently filled with the insulating material (J).

[Step 4]

Step 4 is a step of treating the third intermediate laminate where the hole (H) is filled with the insulating material (J), with a chemical agent. The step of performing treatment with a chemical agent is not particularly limited, and examples include steps 4a, 4b and 4c described above. Hereinafter, steps 4a, 4b and 4c are described in more detail.

Step 4a is a step of removing a smear generated in formation of a non-through hole (R) by laser processing on the third intermediate laminate with the hole (H) filled with the insulating material (J), which undergoes step 3 or on which a metal foil is further stacked in step A described later (provided that step A is performed later than step 3). The "treatment with a chemical agent" in step 4a refers to a treatment for removal of a smear such as a resin generated in formation of a non-through hole (R) and attached on the third intermediate laminate (desmear treatment).

The method for forming the non-through hole (R) by laser processing is not particularly limited, and for example, a processing method performed in usual production of a multilayer printed wiring board, such as a processing method by carbon dioxide laser and a processing method by UV laser, can be used. The shape of the non-through hole (R) is not particularly limited, and may be, for example, any shape obtained in usual production of a multilayer printed wiring board, such as round and elliptical shapes when viewed from the third intermediate laminate surface. In addition, the shape of the cross section in parallel with the stacking direction of the third intermediate laminate, of the non-through hole (R), is also not particularly limited, and may be any shape obtained in usual production of a multilayer printed wiring board, such as square, oblong and trapezoidal shapes.

The size of the non-through hole (R) is not particularly limited and may be any size obtained in usual production of a multilayer printed wiring board, and for example, the cross-sectional area of the hole (R) when viewed from the third intermediate laminate surface (namely, the area of any cross section perpendicular to the stacking direction of the third intermediate laminate) is 0.0003 to 3 $mm^2$. The depth of the non-through hole (R) is also not particularly limited and may be any depth obtained in usual production of a multilayer printed wiring board, for example, 5 to 200 μm.

The desmear treatment method and the kind of the chemical agent for use in the desmear treatment are not particularly limited and may be any desmear treatment method and any chemical agent in usual production of a multilayer printed wiring board. Examples of the desmear treatment method include treatment with a swelling liquid, treatment with a desmear liquid, and treatment with a neutralization liquid. In addition, the chemical agent for use in the desmear treatment may also be a commercially available product.

In addition, conditions of the desmear treatment are appropriately selected depending on the kind of the insulating material for use in the laminate, and the kind and the concentration of the chemical agent. Such a desmear treatment method may be, for example, a method where the third intermediate laminate is immersed in a desmear swelling liquid (trade name "PTH-B103") produced by Okuno Chemical Industries Co., Ltd. at 65° C. for 5 minutes, thereafter immersed in desmear treatment liquids (trade name "PTH1200" and "PTH1200NA") produced by Okuno Chemical Industries Co., Ltd. at 80° C. for 8 minutes, and finally immersed in a desmear neutralization liquid (trade name "PTH-B303") produced by Okuno Chemical Industries Co., Ltd. at 45° C. for 5 minutes.

Step 4b is a step of plating the surface of the metal foil formed in step 3 or step A (provided that step A is performed later than step 3) described later in detail. That is, the "treatment with a chemical agent" in step 4b is a treatment for plating the surface of the metal foil. The treatment for plating the surface of the metal foil is not particularly limited, may be a copper plating treatment to be performed in usual production of a multilayer printed wiring board, and is preferably a copper plating treatment. The plating treatment method and the kind of the chemical agent for use in the plating treatment are not particularly limited, and may be any plating treatment method and any chemical agent in usual production of a multilayer printed wiring board. Examples of the copper plating treatment method include treatment with a degreasing liquid, treatment with a soft etching liquid, acid cleaning, treatment with a predipping liquid, treatment with a catalyst liquid, treatment with an accelerator liquid, treatment with a chemical copper liquid, acid cleaning, and treatment of immersion in a copper sulfate liquid and application of a current. The chemical agent for use in the plating treatment may also be a commercially available product.

In addition, conditions of the plating treatment are appropriately selected depending on the kind of the insulating material for use in the laminate, and the kind and the concentration of the chemical agent. Such a plating treatment method may be, for example, the following method. That is, a method may be adopted where the third intermediate laminate is immersed in OPC-B41 Condiclean (trade name) produced by Okuno Chemical Industries Co., Ltd., as a conditioner liquid, at 65° C. for 5 minutes and thereafter washed with tap water, and immersed in NPE-300 (trade name) produced by Mitsubishi Gas Chemical Company, Inc., as an etching agent, at 25° C. for 1 minute and thereafter washed with tap water, as a pre-treatment; subsequently, the third intermediate laminate after washing with tap water is immersed in 50% sulfuric acid at 25° C. for 3 minutes and thereafter washed with tap water, and then immersed in OPC-SALM (trade name) produced by Okuno Chemical Industries Co., Ltd., as a predipping liquid, at 25° C. for 2 minutes and thereafter washed with tap water; next, the third intermediate laminate after washing with tap water is immersed in OPC-80 Catalyst M (trade name) produced by Okuno Chemical Industries Co., Ltd., as a catalyst liquid, at 25° C. for 6 minutes and thereafter washed with tap water, and furthermore immersed in OPC-500 Accelerator MX (trade name) produced by Okuno Chemical Industries Co., Ltd., as an activating agent, at 28° C. for 8 minutes and thereafter washed with tap water; and thereafter, the third intermediate laminate after washing with tap water is immersed in ATS Add Copper IW (trade name) produced by Okuno Chemical Industries Co., Ltd., as an electroless copper plating liquid, at 32° C. for 10 minutes, immersed in 50% sulfuric acid at 20° C. for 2 minutes, thereafter washed with tap water, and finaiiy immersed in Toprutina SF (trade name) produced by Okuno Chemical Industries Co., Ltd., as a liquid to which copper sulfate is added, at 22° C. for 46 minutes with a current density of 2 A/dm$^2$ being applied, as an electroless copper plating bath treatment.

Step 4c is a step of forming a circuit pattern from the metal foil formed in step 3 or in step A (provided that step A is performed later than step 3) described later in detail by a subtractive method. The method for forming a circuit pattern from the metal foil by a subtractive method is not particularly limited, and may also be a method performed in usual production of a multilayer printed wiring board. For example, formation of a circuit pattern from copper foil by a subtractive method can be performed as follows. A circuit pattern can be formed by, first, using a hydrogen peroxide/sulfuric acid-based soft etching liquid such as CZ-8100 (trade name) produced by MEC Co., Ltd. to etch a copper foil surface by 1 to 2 μm (roughening treatment), then laminating a dry film (RD-1225 produced by Hitachi Chemical Co., Ltd.) on the copper foil surface at a temperature of 110±10° C. and a pressure of 0.50±0.02 MPa; next, performing exposure with a mask exposure machine based on the alignment hole (T), developing a dry film resist in an aqueous 1% sodium carbonate solution, thereafter, removing the copper foil in a region not covered with an etching resist by an aqueous cupric chloride solution, and finally stripping the dry film resist by an amine-based resist stripping liquid. Examples of the treatment with a chemical agent in step 4b include a roughening treatment with a soft etching liquid, removal of copper by an aqueous cupric chloride solution, and treatment with an amine-based resist stripping liquid.

[Step 5]

Step 5 is a step of removing the carrier substrate (G) from the third intermediate laminate. The method for removing the carrier substrate (G) is not particularly limited, and the carrier substrate (G) can be removed by, for example, peeling from the third intermediate laminate manually or mechanically.

[Step A]

Step A is a step of stacking and disposing an insulating material (K) and a metal foil in this order on any of the intermediate laminated bodies or the laminate, and pressurizing them in the stacking direction thereof with heating to allow the insulating material (K) and the metal foil to adhere to the intermediate laminate or the laminate. The method for producing the laminate of the present embodiment can include step A among steps 1 to 4, after step 4 (provided that step 5 is not included), or between step 4 and step 5. For example, the method for producing the laminate can include step A between step 1 and step 2, and/or after step 4. The insulating material (K) that can be used in step A is not particularly limited, for example, the same material as the insulating material (J) in step 3 can be used, and among them, a prepreg is suitable. The metal foil that can be used in step A may be the same as the metal foil described with respect to step 3. The heating and pressurizing treatment method, the heating temperature, the pressurizing pressure, and the heating and pressurizing treatment time in step A are not particularly limited, and may be, for example, the heating and pressurizing treatment method, the heating temperature, the pressurizing pressure, and the heating and pressurizing treatment time in step 3 above, respectively.

[Step B]

Step B is a step of pattern plating the metal layer (M) on any of the intermediate laminate surfaces or the laminate surface to form a circuit pattern. The method for producing the laminate of the present embodiment can include step B among steps 1 to 3 above, and for example, can include step B between step 2 and step 3. The method for forming a circuit pattern by pattern plating is not particularly limited, and the method performed in usual production of a multilayer printed wiring board can be used. For example, a method may be adopted which includes laminating a dry film (RD-1225 (trade name) produced by Hitachi Chemical Co., Ltd.) at a temperature of 110±10° C. and a pressure of 0.50±0.02 MPa, then performing exposure with a mask exposure machine based on the alignment hole (T), developing a dry film resist in an aqueous 1% sodium carbonate solution, thereafter precipitating copper on a metal layer (M) not covered with the resist, by electrolytic copper plating or the like, and finally stripping the dry film resist by an amine-based resist stripping liquid.

[Step C]

Step C is a step of forming a circuit pattern from the metal foil included in any of the intermediate laminated bodies by a subtractive method. The method for producing the laminate of the present embodiment can include step C among steps 1 to 3 above, and for example, can include step C between step 2 and step 3. The method for forming a circuit pattern from the metal foil by a subtractive method is not particularly limited, and a method performed in usual production of a multilayer printed wiring board can be used as in the treatment 4c.

[Laminate Having Build-Up Structure]

A laminate having a build-up structure of the present embodiment is produced by a production method including one or two or more steps of further stacking and disposing a metal foil and an insulating material on one surface or both surfaces of the laminate of the present embodiment, and pressurizing them in the stacking direction thereof with heating. That is, the step can be repeated at least once to thereby prepare a laminate having a build-up structure. The stacking order of the metal foil and the insulating material is not particularly limited. The insulating material that can be used in production of the laminate having a build-up structure is not particularly limited, and may be, for example, the insulating material (J) in step 3, and a prepreg is suitable. In addition, the metal foil is also not particularly limited, and may be, for example, the metal foil described with respect to step 3. The heating and pressurizing treatment method, the heating temperature, the pressurizing pressure, and the heating and pressurizing treatment time in production of the laminate having a build-up structure are not particularly limited, and may be, for example, the heating and pressurizing treatment method, the heating temperature, the pressurizing pressure, and the heating and pressurizing treatment time in step 3 above, respectively.

[Substrate for Mounting a Semiconductor Device]

A substrate for mounting a semiconductor device of the present embodiment is made by a production method including a step of further forming a circuit pattern on the outer layer of the laminate of the present embodiment, by a subtractive method. A circuit pattern may be formed on only one surface or both surfaces of the laminate. The method for forming a circuit pattern by a subtractive method is not particularly limited, and may be the method performed in usual production of a multilayer printed wiring board, as in step 4c above.

The laminate of the present embodiment is a laminate where the hole (H) reaching the support (F) in the carrier substrate (G) is filled with the insulating material (J) to thereby cause less appearance failure and impart a more uniform thickness of the metal layer (M). The laminate is used to thereby allow productivities of a thin printed wiring board and a substrate for mounting a semiconductor device to be higher than conventional one.

EXAMPLES

Hereinafter, the present invention is described with reference to Examples and Comparative Examples in more detail, but the present invention is not limited to these Examples at all.

Example 1

First, a first intermediate laminate with a metal layer (M) 3 formed on both surfaces of a carrier substrate (G) 10, as illustrated in FIG. 1(1), was made as follows (step 1). Prepared was a support (F) 1 including a prepreg (thickness: 0.100 mm, trade name "GHPL-830NS ST56" produced by Mitsubishi Gas Chemical Company, Inc.) obtained by impregnating a glass cloth (glass fiber) with a bismaleimide triazine resin (BT resin) for B-staging. On both surfaces thereof was disposed copper foil with a carrier metal foil (trade name "MT18Ex" produced by Mitsui Mining & Smelting Co., Ltd., 5-μm thin copper foil with 18-μm carrier copper foil, one having a peeling strength of 5 N/m was selected among a plurality of sheets of the copper foil with a carrier metal foil) including carrier copper foil (thickness: 18 μm) 2 and thin copper foil (thickness: 5 μm) 3 stacked and having a peeling strength at the interface therebetween of 5 N/m so that the mat surface of the thin copper foil 3 faced outside (namely, the opposite surface of the mat surface faced the support (F)). Next, the resultant was subjected to a pressing treatment under vacuum (reduced pressure) at a heating temperature of 220° C. and at a pressing pressure in the stacking direction of 3 MPa for 120 minutes, to prepare a first intermediate laminate provided with the carrier substrate (G) 10 and the metal layer (M) 3 including the thin copper foil formed on both surfaces thereof. The planar shape of the first intermediate laminate made was rectangular, and the size was 514 mm×409 mm.

Next, in step 2, a through hole (H) 7 having a diameter of 0.30 mm and a cross-sectional area of 0.071 mm$^2$ was provided by a drill on four corners (peeling likely occurring at the interface between the carrier substrate (G) 10 and the metal layer (M) 3 in treatment with a chemical agent in step 4) of the first intermediate laminate, to provide a second intermediate laminate (FIG. 1(2)). The number of the holes (H) 7 was 5 per corner, and was 20 in total. The position of each of the holes (H) 7 was a position located at a distance of 4 mm from the end portion of the second intermediate laminate, and the interval between adjacent holes (H) 7 was 30 mm.

Subsequently, as illustrated in FIG. 1(3), prepreg 5 (thickness: 0.080 mm, trade name "GHPL-830NS SH65" produced by Mitsubishi Gas Chemical Company, Inc.) obtained by impregnating a glass cloth with a bismaleimide triazine resin (BT resin) for B-staging, and copper foil 6 having a thickness of 12 μm (electrolytic copper foil produced by JX Nippon Mining & Metals Corporation, thickness: 12 μm, trade name "JDLC") were disposed on both surfaces of the second intermediate laminate with the holes (H) 7 formed, and the resultant was subjected to a pressing treatment under vacuum (reduced pressure) at a heating temperature of 220° C. and at a pressing pressure in the stacking direction of 3 MPa for 120 minutes, to provide a third intermediate laminate (step 3).

Next, in order that, in a treatment of the third intermediate laminate obtained in step 3 with a chemical agent, the presence and the degree of penetration of the chemical agent into the interface (peeling surface) between the carrier substrate (G) and the metal layer (M) were confirmed, the third intermediate laminate was subjected to a desmear treatment (step 4). Specifically, first, the third intermediate laminate was immersed in a desmear swelling liquid (trade name "PTH-B103") produced by Okuno Chemical Industries Co., Ltd. at 65° C. for 5 minutes and swollen, thereafter immersed in desmear treatment liquids (trade name "PTH1200" and trade name "PTH1200NA") produced by Okuno Chemical Industries Co., Ltd. at 80° C. for 8 minutes, and finally immersed in a desmear neutralization liquid (trade name "PTH-B303") produced by Okuno Chemical Industries Co., Ltd. at 45° C. for 5 minutes.

Finally, as illustrated in FIG. 1(4), the carrier substrate (G) 10 was peeled from the third intermediate laminate after the desmear treatment, at the interface (peeling surface) between the carrier substrate (G) 10 and the metal layer (M) 3 (step 5), to provide a laminate 9, and the presence of penetration of the chemical agent into the peeling surface was visually confirmed. As a result of visual examination, penetration of the chemical agent into the peeling surface of the laminate 9 was confirmed within a region of up to 5 mm from the end portion of the laminate 9 as illustrated in FIG. 2. Herein, a hole (H) was formed in a portion indicated by an arrow in FIG. 2. In addition, the laminate 9 was polished from the end portion until the cross section of any hole (H)

7 appeared, to observe the cross section of the laminate 9 by a microscope, and it was thus found that the hole (H) 7 was filled with the prepreg.

Comparative Example 1

A laminate was made in the same manner as in Example 1 except that step 2 was not performed, and the presence of penetration of the chemical agent into the peeling surface was visually confirmed. As a result of visual examination, the chemical agent was confirmed to penetrate into the peeling surface of the laminate within a region of up to 50 mm from the end portion of the laminate (see FIG. 4).

It was found from the comparison of the results in Example 1 and Comparative Example 1 that a hole (H) reaching a prepreg as the support (F) in the carrier substrate (G) could be formed in a circumference section not serving as a product of the laminate and being located at a distance of 50 mm or less from the end portion of the laminate, and the hole (H) could be filled with a prepreg as the insulating material (J), to thereby prepare a laminate with penetration of the chemical agent being suppressed. That is, the laminate obtained in Example 1 was found to be better in appearance than the laminate obtained in Comparative Example 1. A section where the appearance of the laminate is not good cannot be used in a printed wiring board and a substrate for mounting a semiconductor device, and is required to be removed by cutting. Accordingly, the laminate obtained Example 1 could allow the amounts of a printed wiring board and a substrate for mounting a semiconductor device to be produced per one thereof, to be larger than those per one of the laminate obtained in Comparative Example 1, and was found to be more excellent in productivity.

Example 2

First, as illustrated in FIG. 5(1), prepared was a support (F) 1 including a prepreg (thickness: 0.100 mm, trade name "GHPL-830NS ST56" produced by Mitsubishi Gas Chemical Company, Inc.) obtained by impregnating a glass cloth with a bismaleimide triazine resin (BT resin) for B-staging. On both surfaces thereof was disposed copper foil with carrier copper foil (trade name "MT18Ex" produced by Mitsui Mining & Smelting Co., Ltd., 5 μm thin copper foil with 18 μm carrier copper foil, one having a peeling strength of 5 N/m was selected among a plurality of sheets of the copper foil with carrier copper foil.) including carrier copper foil (thickness: 18 μm) 2 and thin copper foil (thickness: 5 μm) 3 stacked and having a peeling strength at the interface therebetween of 5 N/m so that the mat surface of the thin copper foil 3 faced outside (namely, the opposite surface of the mat surface faced the support (F)). Next, the resultant was subjected to a pressing treatment under vacuum (reduced pressure) at a heating temperature of 220° C. and at a pressing pressure in the stacking direction of 3 MPa for 120 minutes, to prepare a first intermediate laminate provided with the carrier substrate (G) 10 and the metal layer (M) 3 including the thin copper foil formed on both surfaces thereof (step 1). The planar shape of the first intermediate laminate made was rectangular, and the size was 514 mm×409 mm.

Next, as illustrated in FIG. 5(2), a through hole (H) 7 having a diameter of 0.300 mm and a cross-sectional area of 0.071 mm² was provided by a drill on four corners of the first intermediate laminate and the periphery of an alignment hole (T) 11 to be provided after step 3, to provide a second intermediate laminate (step 2). The arrangement and the number of the holes (H) 7 were as follows: the number of the holes (H) 7 was 5 per corner and was 20 in total at a position located at a distance of 5 mm from the end portion of the second intermediate laminate on four corners of the second intermediate laminate; the interval between adjacent holes (H) 7 was 30 mm; 8 of the holes (H) 7 were provided at a position located at a distance of 5 mm or 7 mm from the end portion of an alignment hole (T) 11 to be provided after step 3, at the periphery of the alignment hole (T) 11; and the interval between adjacent holes (H) 7 was 5 mm. An NC drilling machine being capable of punching a hole with the position coordinate being fixed was used for hole punching at the periphery of the alignment hole (T) 11.

Subsequently, in step B, as illustrated in FIG. 5(3), a photosensitive dry film resist (trade name "RD-1225" produced by Hitachi Chemical Co., Ltd.) was laminated on the surface of the first intermediate laminate, and thereafter exposed and developed according to a predetermined circuit pattern to form a resist. Thereafter, an electrolytic copper plating treatment was performed to precipitate copper on a metal layer (M) not covered with the resist, forming a circuit pattern 4. Next, a resist stripping liquid was used to strip the resist. Next, in order to enhance the adhesion strength between the circuit pattern 4 and a prepreg to be stacked in step 3 described later, an etching agent (trade name "Clean Etch EMR-5000") produced by Mitsubishi Gas Chemical Company, Inc. was used to perform a roughening treatment of the surface of the circuit pattern 4. Thus, a second intermediate laminate was obtained.

Thereafter, in step 3, a prepreg 5 (thickness: 0.080 mm, trade name "GHPL-830NS SH65" produced by Mitsubishi Gas Chemical Company, Inc.) obtained by impregnating a glass cloth with a bismaleimide triazine resin (BT resin) for B-staging, and copper foil 6 having a thickness of 12 μm (electrolytic copper foil produced by JX Nippon Mining & Metals Corporation, thickness: 12 μm, trade name "JDLC") were disposed on both surfaces of the second intermediate laminate with the holes (H) 7 formed, and subjected to a pressing treatment under vacuum (reduced pressure) at a heating temperature of 220° C. and at a pressing pressure in the stacking direction of 3 MPa for 120 minutes, to provide a third intermediate laminate (see FIG. 5(4)).

Furthermore, as illustrated in FIG. 5(5), an X-ray hole punching apparatus was used to form an alignment hole (T) 11 (round shape, diameter: 2.0 mm). Next, as illustrated in FIG. 5(6), a photosensitive dry film resist (trade name "RD-1225" produced by Hitachi Chemical Co., Ltd.) was laminated on the surface of the third intermediate laminate. Thereafter, the resultant was exposed in concert with the alignment hole (T) 11 according to a predetermined circuit pattern, and subjected to a development treatment with an aqueous 1% sodium carbonate solution, to form an etching resist. Furthermore, copper foil 6 not covered with the etching resist was removed by an aqueous cupric chloride solution, and furthermore the etching resist was stripped by a resist stripping liquid to form a circuit pattern from the copper foil 6 on the third intermediate laminate surface (step 4c).

Next, in order that, in the treatment with a chemical agent, the presence and the degree of penetration of the chemical agent into the interface (peeling surface) between the carrier substrate (G) 10 and the metal layer (M) 3 were confirmed, the third intermediate laminate that underwent step 4c was subjected to a desmear treatment (step 4). Specifically, first, the third intermediate laminate was immersed in a desmear swelling liquid (trade name "PTH-B103") produced by Okuno Chemical Industries Co., Ltd. at 65° C. for 5 minutes and swollen, thereafter immersed in desmear treatment liquids (trade name "PTH1200" and trade name "PTH1200NA") produced by Okuno Chemical Industries Co., Ltd. at 80° C. for 8 minutes, and finally immersed in a desmear neutralization liquid (trade name "PTH-B303") produced by Okuno Chemical Industries Co., Ltd. at 45° C. for 5 minutes.

Finally, as illustrated in FIG. 5(7), the carrier substrate (G) 10 was peeled from the third intermediate laminate after the desmear treatment, at the interface (peeling surface) between the carrier substrate (G) 10 and the metal layer (M) 3 (step 5), to provide a laminate 9, and the presence of penetration of the chemical agent into the peeling surface was visually confirmed. As a result of visual examination, penetration of the chemical agent into the peeling surface of the laminate 9 was confirmed within a region of up to 2 mm from the end portion of the alignment hole (H) 11, as illustrated in FIG. 6. Herein, a hole (H) was formed in a portion indicated by an arrow in FIG. 6. In addition, penetration of the chemical agent into the peeling surface of the laminate 9 was confirmed within a region of up to 5 mm from the end portion of the laminate 9 as in Example 1 (not illustrated). Furthermore, the laminate 9 was polished from the end portion until the cross section of any hole (H) 7 appeared, to observe the cross section of the laminate 9 by a microscope, and it was thus found that the hole (H) 7 was filled with the prepreg.

Example 3

A laminate was made in the same manner as in Example 2 except that 8 of the holes (H) 7 at the periphery of the alignment hole (T) 11 were provided at a position located at a distance of 2 mm or 3 mm from the end portion of the alignment hole (T) 11 in Example 2, and the presence of penetration of the chemical agent into the peeling surface was visually confirmed. As a result of visual examination, penetration of the chemical agent into the peeling surface was confirmed within a region of up to 2 mm from the end portion of the alignment hole (T) 7 (see FIG. 7). Herein, a hole (H) was formed in a portion indicated by an arrow in FIG. 7. In addition, penetration of the chemical agent into the peeling surface of the laminate 9 was confirmed within a region of up to 5 mm from the end portion of the laminate 9 as in Example 1 (not illustrated). Furthermore, the laminate 9 was polished from the end portion until the cross section of any hole (H) 7 appeared, to observe the cross section of the laminate 9 by a microscope, and it was thus found that the hole (H) 7 was filled with the prepreg.

Comparative Example 2

A laminate was made in the same manner as in Example 2 except that step 2 was not performed, and the presence of penetration of the chemical agent into the peeling surface was visually confirmed. As a result of visual examination, the chemical agent was confirmed to penetrate into the peeling surface of the laminate within a region of up to 30 mm from the alignment hole (T) (see FIG. 9). In addition, the chemical agent was confirmed to penetrate within a region of up to 50 mm from the end portion of the laminate (not illustrated).

It was found from the comparison of the results in Examples 2 and 3 and Comparative Example 2 that a hole (H) could be provided at the periphery of an alignment hole (T) to be provided after step 3 for the purpose of formation of a circuit pattern and the hole (H) could be filled with a prepreg as an insulating material (J), to thereby prepare a laminate with penetration of a chemical agent being suppressed even at the periphery of the hole (T). That is, the laminate obtained in each of Examples 2 and 3 was found to be better in appearance than the laminate obtained in Comparative Example 2. The laminate obtained in each of Examples 2 and 3 allowed the amounts of a printed wiring board and a substrate for mounting a semiconductor device to be produced per one thereof, to be larger than those per one of the laminate obtained in Comparative Example 2, and was found to be more excellent in productivity.

The present application is based on Japanese Patent Application (Japanese Patent Application No. 2014-147703) filed on Jul. 18, 2014, the content of which is herein incorporated as reference.

INDUSTRIAL APPLICABILITY

The present invention can provide a laminate made by stacking a metal foil and an insulating material on an intermediate laminate provided with a carrier substrate and a peelable metal layer formed on the substrate, and if necessary, finally removing the carrier substrate, wherein penetration of a chemical agent into the interface between the carrier substrate and the peelable metal layer is suppressed; a substrate for mounting a semiconductor device made from the laminate; and methods for producing them. Accordingly, the present invention has industrial applicability in such fields.

REFERENCE SIGNS LIST

1: support (F), 2: carrier copper foil, 3: thin copper foil (metal layer (M)), 4: circuit pattern, 5: prepreg, 6: copper foil, 7: hole (H), 9: laminate, 10: carrier substrate (G), 11: alignment hole (T).

The invention claimed is:
1. A method for producing a laminate, comprising at least:
providing a first intermediate laminate comprising a carrier substrate including a support in the carrier substrate and a peelable metal layer formed on at least one surface of the carrier substrate,
forming, in a section to be cut and removed from the laminate, the section corresponding to a section not constituting a substrate for mounting a semiconductor device, a first hole reaching at least the support in the carrier substrate from a surface of the first intermediate laminate, to prepare a second intermediate laminate with the first hole,
stacking and disposing on the surface where the first hole is formed of the second intermediate laminate, an insulating material and a metal foil in this order when viewed from the surface, and pressurizing the second intermediate laminate, the insulating material and the metal foil in a stacking direction of the insulating material and the metal foil with heating, to prepare a third intermediate laminate where the first hole is filled with the insulating material, and
performing treatment with a chemical agent on the third intermediate laminate where the first hole is filled with the insulating material.
2. A method for producing a substrate for mounting a semiconductor device, comprising forming a circuit pattern on an outer layer of a laminate obtained by the method for producing the laminate according to claim 1, by a subtractive method.

\* \* \* \* \*